(12) United States Patent
Hamilton et al.

(10) Patent No.: US 7,174,491 B2
(45) Date of Patent: Feb. 6, 2007

(54) DIGITAL SYSTEM AND METHOD FOR TESTING ANALOGUE AND MIXED-SIGNAL CIRCUITS OR SYSTEMS

(75) Inventors: David James Hamilton, Edinburgh (GB); Brian Philip Stimpson, Glasgow (GB); Mahmoud Ali Mousa Bekheit, Cairo (EG)

(73) Assignee: University of Strathclyde, Glasgow (GB)

( * ) Notice: Subject to any disclaimer, the term of this patent is extended or adjusted under 35 U.S.C. 154(b) by 0 days.

(21) Appl. No.: 10/518,743

(22) PCT Filed: Jun. 17, 2003

(86) PCT No.: PCT/GB03/02599

§ 371 (c)(1),
(2), (4) Date: Jul. 13, 2005

(87) PCT Pub. No.: WO03/107019

PCT Pub. Date: Dec. 24, 2003

(65) Prior Publication Data

US 2006/0242498 A1    Oct. 26, 2006

(30) Foreign Application Priority Data

Jun. 17, 2002  (GB) ................................ 0213882.4

(51) Int. Cl.
*G01R 31/28* (2006.01)
*G06F 11/00* (2006.01)

(52) U.S. Cl. ..................... 714/724; 714/741; 714/47

(58) Field of Classification Search ..................... None
See application file for complete search history.

(56) References Cited

U.S. PATENT DOCUMENTS

| 5,694,356 | A |  | 12/1997 | Wong et al. |
| 5,745,409 | A |  | 4/1998 | Wong et al. |
| 5,748,124 | A |  | 5/1998 | Rosenthal et al. |
| 5,793,778 | A |  | 8/1998 | Qureshi |
| 6,467,058 | B1 | * | 10/2002 | Chakradhar et al. ........ 714/745 |

(Continued)

FOREIGN PATENT DOCUMENTS

WO    WO 98/55880    12/1998

OTHER PUBLICATIONS

Zheng et al.; *A Novel Test Generation Approach for Parametric Faults in Linear Analog Circuits*; 14th IEEE VLSI Test Symposium; 1996; pp. 470-475 (XP-002265465).

(Continued)

*Primary Examiner*—Phung My Chung
(74) *Attorney, Agent, or Firm*—Alston & Bird LLP

(57) ABSTRACT

A method of optimising a digital test signal for testing an analogue or mixed-signal circuit comprising determining a measure, for example a figure of merit, that is indicative of differences between the output of a fault free and the output of a known faulty circuit in response to an applied digital input signal. The digital input signal is then varied and another figure of merit is calculated for the fault free and the known faulty circuit for the new input signal. This is repeated a number of times, the digital input signal being varied each time. An optimum test signal is selected based on the determined figures of merit.

49 Claims, 13 Drawing Sheets

U.S. PATENT DOCUMENTS 6,898,746 B2* 5/2005 Jain et al. .................. 714/724
2002/0188904 A1* 12/2002 Chen et al. ................ 714/741

OTHER PUBLICATIONS

Saab et al.; *CRIS: A Test Cultivation Program for Sequential VLSI Circuits*; IEEE; 1992; pp. 216-219.

Van Spaandonk et al.; *Selecting Measurements to Test the Functional Behavior of Analog Circuits*; Journal of Electronic Testing: Theory and Applications; 1996; pp. 9-18; vol. 9; Kluwer Academic Publishers, The Netherlands (XP-000636621).

Balivada et al.; *A Unified Approach for Fault Simulation of Linear Mixed-Signal Circuits*; Journal of Electronic Testing: Theory and Applications; 1996; pp. 29-41; vol. 9; Kluwer Academic Publishers, The Netherlands (XP-000636623).

Souders, et al., *Accurate Frequency Response Determinations from Discrete Step Response Data*; IEEE Transactions on Instrumentation and Measurement; Jun. 1987; pp. 433-439; vol. IM-36, No. 2.

Eckersall, et al., *Testing an Analogue Circuit Using a Complementary Signal Set*; IEE Colloquium on Testing Mixed Signal Circuits, 1992; pp. 5/1-5/6; Digest No. 1992/118.

Al-Qutayri, et al., *Go/no-go Testing of Analogue Macros*; IEE Proceedings; Aug. 1992, pp. 534-540; vol. 139, No. 4.

Pan, et al.; *Pseudorandom Testing for Mixed-Signal Circuits*; IEEE Transactions on Computer-Aided Design of Integrated Circuits and Systems; Oct. 1997; pp. 1173-1185; vol. 16, No. 10.

Variyam, et al.; *Digital-Compatible BIST for Analog Circuits Using Transient Response Sampling*; IEEE Design & Best of Computers; Jul.-Sep. 2000; pp. 106-115.

Hooke, et al.; *"Direct Search" Solution of Numerical and Statistical Problems*; May 1960, revised Oct. 1960; pp. 212-229; Westinghouse Research Laboratories; Pittsburgh, Pennsylvania.

Search Report for International Application No. PCT/GB03/02599 completed Apr. 20, 2004.

International Preliminary Examination Report for International Application No. PCT/GB03/02599 completed Nov. 2, 2004.

* cited by examiner ic Circuits Using Transient Response Sampling", IEEE Design & Test of Computers, pp. 106–115, July–September 2000.

DIGITAL SYSTEM AND METHOD FOR TESTING ANALOGUE AND MIXED-SIGNAL CIRCUITS OR SYSTEMS

FIELD OF THE INVENTION

The present invention relates to a digital system and method for testing analogue and mixed-signal (analogue and digital) circuits or systems.

BACKGROUND OF THE INVENTION

Testing of circuits is an essential step in the manufacture of high quality and reliable electronic products. The cost of an electronic product is related to the cost of the tests and the time necessary to generate and apply these. In terms of testing, mixed analogue and digital circuits, so called mixed-signal circuits, can be particularly time consuming and costly. Indeed, it has been reported that one of the greatest challenges in the coming years is the development of low-cost automatic test equipment for testing mixed-signal integrated circuits, see "International Technology Roadmap for Semiconductors", 1999, published by the Semiconductor Industry Association (SIA).

Analogue signals are continuous as a function of both time and amplitude. Therefore the amount of information to be processed during testing is potentially very large. Unlike digital systems, interpreting whether an analogue output signal does or does not actually indicate a fault can be ambiguous. This inability to discriminate is made worse by the greater functionality and complexity of even the simplest analogue circuit, particularly if input signals are limited in complexity or time duration. In addition, because output signals are analogue, there can be no ideal performance from a completely "correct" circuit. Instead all assessment must be based on the concept that each component is subject to tolerances, which contribute towards variability in system behaviour even under fault-free conditions. All of these features make the testing of analogue circuits somewhat problematic.

One of the main problems with testing mixed-signal circuits is the need for separate analogue and digital test instruments. Over the past few years, a number of approaches have been proposed to unify the test method for mixed-signal systems. These approaches include power supply monitoring, digital modelling of analogue circuits and the use of digital test signals. As regards the use of digital signals, a number of techniques have been suggested, for example step response testing. This is described by Souders et al in the article "Accurate Frequency Response Determinations from Discrete Step Response Data", IEEE-Trans. on Instrumentation and Measurement, Vol. IM-36, No. 2, pp. 433–9, June 1987. Testing using a complementary signal set is another proposed method for digital testing of analogue circuits. This is described by Eckersall et al in the article "Testing an Analogue Circuit using a Complementary Signal Set", IEE Colloquium on *Testing Mixed Signal Circuits*", Digest No. 1992/118, pp. 5/1–5/6, 1992. Pseudorandom testing is yet another option. Examples of this are described by: a) Al-Qutayri et al in "Go/No-Go Testing of Analogue Macros", IEE Proc. Circuits, Devices and Systems, Vol. 139, No. 4, pp. 534–540, August 1992; b) Pan et al in "Pseudo-random Testing for Mixed-Signal Circuits", IEEE Trans. on Computer-Aided Design of Integrated Circuits and Systems, Vol. 18, No. 10, pp. 1173–1185, October 1997, and c) Variyam et al in "Digital-Compatible BIST for Analog Existing digital approaches for testing mixed-signal systems have had limited success. Nevertheless, because of the advantages of using a digital signal to test mixed-signal circuits, significant and continuing efforts are being made to investigate this. However, despite extensive research, a satisfactory solution to the problem of how to test analogue and/or mixed-signal circuits using a digital signal has not been found.

An object of the invention is to provide an improved method and system for digital testing of analogue and mixed-signal circuits.

SUMMARY OF THE INVENTION

The invention is based on the realisation that the specific nature of the digital test signal applied to an analogue or mixed signal circuit is key to successful testing. Hence, the test signal must be carefully optimised on a per circuit basis in order to ensure that faults can be detected quickly and accurately. Once the optimised test signal is obtained, a very simple set up can be used in the test application mode, during which real circuits are tested. It is envisaged that the real-time testing of circuits during manufacture would be automated.

According to a first aspect of the present invention, there is provided a method of optimising a digital test signal for testing an analogue or mixed-signal circuit using a suitable optimisation algorithm. The optimisation process aims to identify or design the optimum digital signals for use in the testing method, such that all or at least most of the defects that may occur during manufacture stage can be robustly identified. The method comprises applying a plurality of different digital inputs to a fault free circuit and a faulty circuit, preferably software-based simulations of the fault free and faulty circuits; monitoring the corresponding outputs of the fault free and the faulty circuits for each input, and using the outputs produced to identify an improved test input and iteratively repeating this to as part of an optimisation procedure, thereby to identify an optimum input. The method may further comprise determining a measure, for example a figure of merit, that is indicative of potential differences between output responses of a fault free and a known faulty circuit to a digital input signal; varying the input digital signal; calculating a measure, e.g. a figure of merit, using the output responses of the fault free and the known faulty circuit to the varied input signal; and selecting an improved test signal based on the determined figures of merit.

The method is implemented using a computer-based simulation of the fault free and faulty circuits. Preferably, the selected input signal has a maximum figure of merit. Preferably, the process of varying is repeated a plurality of times, thereby to determine the best variation of the initial test signal. Preferably the signal is varied according to pre-determined criteria. By appropriately selecting, for example by maximising the figure of merit, an optimum digital test signal can be found for identifying circuits that have the known fault.

The method may involve testing a range of different initial starting input digital test signals, each of these being varied as set out above to find a local optimum. Once this is done, the method may then further involve comparing all of the local optima and their corresponding figures or merit and selecting the signal with the best overall figure of merit.

The figure of merit may be determined using analogue outputs for each of the fault free and the known faulty circuit. An advantage of using the analogue response is that it naturally guides the search for a test signal towards an optimum value. The figure of merit that is derived from the analogue responses contains information about potential improvements in the digital figure of merit that is used in the actual test mode. A further advantage is that the analogue figure of merit is relatively immune to the effects of noisy or very small responses. Prior to determining the figure of merit, the analogue signal may be processed to prevent domination of large differences in the output. This avoids the optimisation increasing further any instantaneous values of difference in amplitude between the two analogue signals once that difference is sufficiently large to provide adequate discrimination. This can be achieved by applying to the signal a function having an output that saturates at two different predetermined values (often −1 and +1) for extreme negative and positive values of input. In between these saturation regions, the function should increase monotonically, and hence be single-valued. An example of a suitable function is the sigmoidal function, which employs a non-linear squashing function based on the sigmoid or logistic equation. More specifically, the hyperbolic tan function (tanh) may be used.

Additionally or alternatively, the analogue signal may be processed to take into account acceptable variations in the output caused by device tolerances.

The figure of merit may be determined using digital outputs from the circuit under test (CUT).

The figure of merit may be a fault detection ratio, which is defined as the proportion of a set of predefined faults that can actually be detected according to a set of criteria for fault discrimination. A fault detection ratio of unity is the ultimate objective of the optimisation process. The figure of merit may be the Hamming distance between the digital output response for the fault free circuit and the output response for the faulty circuit. The figure of merit may be proportional to or a function of the Hamming distance. Additionally or alternatively, the figure of merit may be a composite of some or all of the above.

The method may further involve determining a figure of merit for each one of a plurality of different faulty circuits, each of these figures of merit being indicative of potential differences between output responses of the fault free and modelled faulty circuits, and determining a composite figure of merit using each of these. In this case, the composite figure of merit represents the ability of an applied test signal to effectively detect the presence of faults in the CUT. The modelled faulty circuits may include circuits that have faults on a single component/parameter or on multiple components/parameters. This is advantageous. Of course, it will be appreciated that in practice to optimise this approach, it is necessary to select the most common or expected combination of faults for a given circuit.

The process of varying the input digital signal may involve changing the length of one or more individual pulses in the applied digital input signal. The length of individual pulses may be varied by the same amount or by increasingly large or small amounts or by different amounts, which different amounts may be selected randomly or according to predefined criteria. The length (time-duration) of all of the pulses may be varied by the same amount in sequence one after the other, a figure of merit being determined each time one pulse length is changed. Once this is done and in the event that a sequence having an improved figure of merit is not determined, the method may further involve changing the size of the amount by which the pulse lengths are varied and repeating the process of varying.

Additionally or alternatively, the process of varying the input digital signal may involve applying a pre-determined function to the input sequence, such as a pattern shift function, which function in effect modifies all pulses in the input pattern at once. The step of applying a pre-determined function to the input sequence may occur after an improved sequence is found by varying the individual pulse lengths.

Additionally or alternatively, exhaustive evaluation of the figures of merit for all possible sequences of limited length (number of bits, each bit of certain time-duration) may be used to find good initial or starting sequences. In order to achieve this, the process of varying may involve varying the frequency of the input signal, the frequency being defined by the reciprocal of signal time-duration. The frequency may be incrementally varied by a pre-determined amount over the bandwidth of the CUT. For each frequency, for each length and for each possible sequence a figure of merit is determined. The signal with the highest figure of merit is selected and preferably used as the initial input signal. In this way, a coarse search for a starting sequence can be done. Random starting sequences may also be employed.

Additionally or alternatively, the method in which the invention is embodied could be used to determine the functional performance of CUTs. To do this, rather than optimising the input signal based on known faults, the signal is optimised to take into account variations in values of functional specifications. This would involve transforming the deviation in CUT specifications to a corresponding deviation in components values. In this way, not only the presence of a fault could be detected but also the deviation of one or many of the CUT specifications could be detected.

According to another aspect of the invention, there is provided a digital test signal or of a copy thereof for testing analogue or mixed signal circuits that is a product of the method in which the first aspect of the invention is embodied.

According to yet another aspect of the invention, there is provided a method for testing analogue and/or mixed-signal circuits using a digital signal, the method comprising applying to the CUT an optimised test signal as determined using the method in which the first aspect of the invention is embodied; comparing an output of the CUT with an expected output for a good circuit and determining a fault based on a result of the step of comparing. In the event that the outputs are substantially the same, within an accepted tolerance range, this indicates that the CUT is fault free. In the event that the outputs are different, these differences lying outside the accepted tolerance range, this indicates that the CUT is faulty.

The outputs from the CUT may be analogue. The method may further involve digitising the output of the CUT, wherein the step of comparing may involve comparing the digitised outputs. The digitising of the output of the CUT may involve one or multiple quantisation levels.

The method may further involve storing an output for a fault free CUT with an acceptable tolerance range for an optimised input test signal and comparing the stored output with the actual output of the CUT. The stored and actual outputs may be digitised. The step of comparing the stored and actual digital outputs may comprise calculating the Hamming distance between them.

The method may further comprise storing outputs for one or more known faults for the optimised digital test signal and comparing an output from a circuit under test with these, so that in the event that there is a match, this indicates not only that there is a fault but possibly also the nature of that fault. Preferably, the stored outputs for the one or more known faults include an acceptable tolerance range for the applied optimised input test signal. In this way, a faulty circuit that has one faulty component and variations in its other component values due to tolerances can be identified.

In the event that the gain of the circuit is to be tested, the method may further involve modifying the input offset voltage and/or the amplitude of the digital test signal. Preferably, this is done in conjunction with the output threshold level.

According to yet a further aspect of the present invention, there is provided a system for optimising a digital test signal for testing an analogue or mixed-signal circuit using a digital signal, the system comprising means for determining a figure of merit that is indicative of differences between responses of a fault free and a faulty analogue or mixed signal circuit to an input digital signal; means for varying the input digital signal; means for determining a figure of merit for the varied input signal, and means for selecting an optimum test signal based on the determined figures of merit. Preferably, the means for selecting are operable to determine and select the input signal that has the maximum figure of merit. Preferably, the means for varying are operable to vary the input signal a plurality of times, so that a range of signals are tried, each of these being derived from the starting input. Preferably, the input signal is varied according to pre-determined criteria.

The means for determining the figure of merit may be operable to use analogue outputs from the CUT. The means for determining the figure of merit may be operable to use digital outputs from the CUT.

The system may further comprise means for determining a figure of merit for each one of a plurality of different faulty circuits and determining a composite figure of merit combining all of these.

The means for varying the input signal may comprise means for changing the length of one or more individual pulses in the applied digital input signal. The means for changing the length of individual pulses may be operable to vary the pulse length by the same amount or by increasingly large or small amounts or by different amounts, which different amounts may be selected randomly or by pre-defined scheme.

Additionally or alternatively, the means for varying may comprise means for varying the frequency of the input digital signal, the frequency being defined by the reciprocal of signal time-duration.

According to still another aspect of the invention, there is provided a system for testing analogue and/or mixed-signal circuits using a digital signal, the system comprising means for applying to the circuit under test an optimised test signal as determined using the method in which the first aspect of the invention is embodied; means for comparing an output of the CUT with an expected output for a good circuit and means for determining a fault based on an output from the means for comparing. In the event that the outputs are substantially the same, within an accepted tolerance range, this indicates that the CUT is fault free. In the event that the outputs are different, these differences lying outside the accepted tolerance range, this indicates that the CUT is faulty.

The outputs from the CUT may be analogue. Means may be provided for digitising the outputs of the CUT and the means for comparing may be operable to compare the digitised outputs.

According to a still further aspect of the present invention, there is provided a computer program for use in a method of testing an analogue or mixed-signal circuit using a digital signal, the computer program being provided preferably on a data carrier or computer readable medium and having code or instructions for determining a figure of merit that is indicative of potential differences between output responses of a fault free and a known faulty circuit in response to a digital input signal; varying the input digital signal according to pre-determined criteria; calculating another figure of merit that is indicative of differences between the outputs of the fault free and the known faulty circuits in response to the varied digital input signal; and selecting an optimum test signal based on the determined figures of merit. Preferably, the selected input signal has a maximum figure of merit. Preferably, the step of varying is repeated a plurality of times, thereby to determine the best test signal.

The computer program may have code or instructions for modelling output responses for the fault free and faulty circuits.

The various figures of merit may be determined using analogue outputs from each of the fault free and the faulty circuits. The figure of merit may be determined using digital outputs from the CUT. The figure of merit may be the fault detection ratio. The figure of merit may be the Hamming distance between the digitised output response for the fault free circuit and the output response for the known faulty circuit. The figure of merit may be a composite of some or all of the above.

The computer program may have code or instructions for determining a figure of merit for each one of a plurality of different faulty circuits, each of these figures of merit being indicative of differences between output responses of the fault free and faulty circuits, and determining a composite figure of merit using each of these.

The code or instructions for varying the input signal may be adapted to change the length of one or more individual pulses in the applied digital input signal. The length of individual pulses may be varied by the same amount or by increasingly large or small amounts or by different amounts, which different amounts may be selected randomly or according to a predefined scheme. The length of all of the pulses may be varied by the same amount in sequence one after the other, a figure of merit being determined each time one pulse length is changed.

Additionally or alternatively, the code or instructions for varying may be adapted to apply a pre-determined function to the input sequence, such as a pattern shift function, which function in effect modifies all pulses in the input pattern at once. The pre-determined function may be applied to the input sequence after an improved sequence is found by varying the pulse lengths.

Additionally or alternatively, exhaustive evaluation of the figures of merit for all possible sequences of limited length (number of bits) may be used to find good initial or starting sequences. The code or instructions for exhaustive evaluation may be operable to vary the frequency of the input signal, the frequency being defined by the reciprocal of signal time-duration. The frequency may be incrementally varied by a pre-determined amount over the bandwidth of the CUT. For each frequency, for each length and for each possible sequence a figure of merit is determined. The sequences with the highest figure of merit are selected and preferably used the initial input signals.

According to still another aspect of the invention, there is provided a computer program for use in a method of testing an analogue or mixed-signal circuit using a digital signal, the computer program being provided preferably on a data carrier or computer readable medium and having code or instructions for applying to a CUT a test signal as determined using the method in which the first aspect of the invention is embodied; comparing an output of the CUT with an expected output for a good circuit and determining whether there is a fault based on an output from the means for comparing.

The outputs from the CUT and the fault free circuits may be analogue. The computer program may be operable to use digitised outputs of the CUT and fault free circuits when comparing the fault free and CUT outputs.

The method may further involve storing a figure of merit for a circuit having a known fault and comparing the figure of merit for the CUT with that for the known fault. In the event that there is a match, this indicates not only that there is a fault but the nature of that fault. This is advantageous.

According to another aspect of the invention, there is provided a test system that includes means for generating an optimised digital test signal as determined using the method of the first aspect of the invention, means for applying the digital test signal to an analogue or mixed-signal CUT, means for comparing an output of the CUT with an expected output for a good circuit, which is also stored or generated locally, and means for determining a fault based on an output from the means for comparing.

The outputs from the CUT may be analogue. Means may be provided for digitising the outputs of the CUT and the means for comparing may be operable to compare the digitised outputs.

The above mentioned test system may be provided on the same chip as the CUT. The test system may be provided as a self-test facility.

According to yet another aspect of the present invention, there is provided a electronic device, such as a mobile telephone, that includes a test system that has means for generating an optimised digital test signal as determined using the method of the first aspect of the invention, means for applying the digital test signal to an analogue or mixed-signal CUT, means for comparing an output of the CUT with an expected output for a good circuit, which is also stored or generated locally, and means for determining a fault based on an output from the means for comparing.

BRIEF DESCRIPTION OF THE DRAWINGS

Various aspects of the invention will now be described by way of example only and with reference to the accompanying drawings, of which.

DETAILED DESCRIPTION OF THE INVENTION

The aim of mixed-signal testing is to detect manufacturing defects. Integrated circuits can have two types of permanent faults, namely catastrophic or parametric faults. A catastrophic fault is one in which the component is destroyed, for example by virtue of a short circuit, an open circuit or a topological change. With parametric faults, the component continues to function, but outside the nominal tolerance band. Examples of faults that have to be detected include: short circuit, open circuit, positive deviation from fault free behaviour and negative deviation. By choosing a suitable binary test signal, these can be identified.

In accordance with the present invention, two modes of operation have to be carried out in order to test mixed-signal circuits. Firstly, a test development mode is conducted to determine the optimum test signal. When a suitable test signal is identified, a test application mode uses that optimised signal to test circuits. This is done by applying the signal to the CUT and monitoring its response.

The test development mode includes three basic steps, these being determination of a potential fault list, identification of an efficient input test pattern, and storage of a threshold for fault detection. The efficient input test pattern is used to derive a reference output pattern for the fault-free CUT. Every CUT has unique input and output reference patterns. These circuit-dependent reference patterns are stored in a database. When the test development mode is completed, the test application mode is entered. At this stage, a similarity or comparison measurement between the actual response of a circuit and the stored reference pattern is performed. If they are sufficiently different, then the CUT is declared faulty. Otherwise, the circuit is deemed acceptable.

Figure 1:
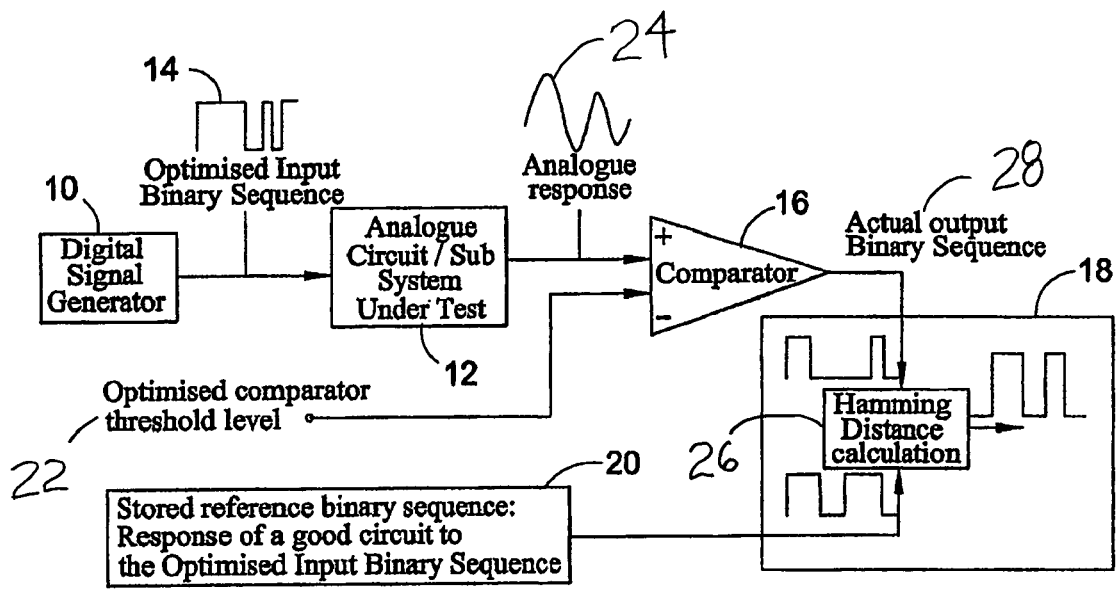
FIG. 1 is a block diagram of a test system for testing analogue or mixed-signal circuits.

FIG. 1 shows a circuit for digital testing of analogue and/or mixed-signal circuits. This has a digital signal generator 10 for applying a digital test signal to the mixed-signal circuit 12 that is to be tested. The test signal 14 is a periodic discrete interval binary sequence of N bits. By this it is meant that the input signal can change between the two possible levels only at discrete intervals of time, which intervals are normally equally spaced. This is done in order to limit the complexity of the simulation and the amount of information generated. This is not a fundamental limitation, but is nevertheless a useful practical requirement. For the sake of simplicity, the input sequence 14 may be kept as simple as possible and hence the corresponding discrete interval of time will be no shorter than required to characterise the circuit together with expected faults. The methodology for identifying an optimum input signal is described later.

This input test sequence is fed through a buffer from a digital signal generator 10 and into the CUT 12. Connected to the output of the CUT is a comparator 16 for comparing the CUT output signal with an optimized threshold 22. The comparator 16 is in turn connected to processor 18 that has access to a memory 20 in which are stored the reference outputs for a fault free version of the CUT, as well as reference outputs for circuits with known faults. Whilst not shown on FIG. 1, it will be appreciated that the system must be synchronized to a master clock so that testing is performed with synchronized input/output binary sequences. In addition, the comparator output must be digitized faster than the clock speed of the input sequence for precise recording of the zero crossings.

When a circuit is to be tested, the digital test signal 14 is applied to it. The resulting output signal 24 from the CUT is analogue. This is passed to the comparator 16 for processing. The comparator 16 in effect reduces the analogue response 24 of the CUT 12 to threshold crossings recorded against time. The output 28 of the comparator 16 is either logic high or logic low depending upon the result of comparison between the CUT response and the comparator 16 threshold and so is a binary sequence of 0s and 1s that is indicative of the digital response of the circuit. Examples of (i) analogue responses from the CUT and (ii) the corresponding one-bit quantized responses from the comparator 16 are shown in FIGS. 2(a) and (b).

The binary signal output 28 from the comparator 16 is then passed to the processor 18 for comparing it with the stored reference binary sequence for a substantially fault free CUT, 20. More specifically, the two binary signals are compared and the Hamming distance 26 between them is calculated. The Hamming distance 26 between two binary sequences is the number of digits in one of the two sequences that have to be changed to make it the same as the other. This task may be alternatively accomplished using combinational logic circuitry.

In the event that the output from the test circuit and the stored sequence are the same, within a pre-determined limit, i.e. the Hamming distance 26 is substantially zero, this indicates that the circuit is acceptable. In contrast, should the output 28 and the stored sequence 20 be different, i.e. should the Hamming distance 26 be non-zero, this indicates that the tested CUT is faulty. In this event, an alarm is raised and the circuit is designated as being faulty. Hence, by means of a one-bit quantization, a straightforward, cost effective and fast means of detecting faults is provided. It should be noted that in practice, differences in some timeslots due to component tolerances are non-diagnostic and are excluded from the evaluation. This will be discussed in more detail later.

The key to successful testing of an analogue or mixed-signal circuit is the rapid detection of as many potential faults as possible. A good digital input sequence detects all or at least most of the considered faults for a particular circuit. Therefore, in order to optimise testing, it is necessary firstly to find the best binary sequence for inputting to the CUT to detect faults. This can be done by exploring the behaviour of all possible sequences that meet specified criteria. The strategy used to do this is to develop a test methodology using a computer-based simulation of the circuit-under-test. The principal reason for simulating the performance of circuits is to enable direct control over fault conditions, which control cannot be achieved with hardware. Other reasons are speed of execution and flexible facilities to automate the entire design process. Furthermore, diagnostic information is available which could not practicably be accessed on real hardware. It is important also that there should be control over tolerances. Again, this cannot be achieved with real components. Feasibility of this approach requires availability of software to determine the output of any specified circuit to any specified input signal. Commercial software for doing this, generally based on methodology known as Spice, has been available for many years. This can be adapted to put the method in which the invention is embodied into practice.

To identify an optimised test signal, a multi-dimensional hill climbing search algorithm is implemented. This algorithm uses a figure of merit as a measure of how good an input signal is at detecting faults. In order to limit the complexity of the calculations and amount of information, the input signals used are discrete interval binary sequences, i.e. they change between the two possible levels only at discrete intervals of time, which intervals are normally equally spaced. As noted before, this is not a fundamental limitation, but is nevertheless a useful practical requirement. Ideally, the input sequence should be kept as simple as possible and hence the corresponding discrete interval of time will be no shorter than required to characterise the circuit together with expected faults.

In the present case, the figure of merit is a measure of the effectiveness of a binary input sequence in detecting faults. The input sequence with the maximum figure of merit is considered the best. Hence, the main objective of the optimisation procedures is to find the maximum value of the figure-of-merit and the coordinates of the binary sequence for which this value is achieved.

In practice, the figure of merit could be extracted from either the analogue response that is output directly from the CUT or from a one-bit digitised response that is provided by passing the analogue signal through a comparator, thereby providing analogue and digital figures of merit AFM and DFM respectively. These are related as can be shown from the following analysis.

Figure 3:
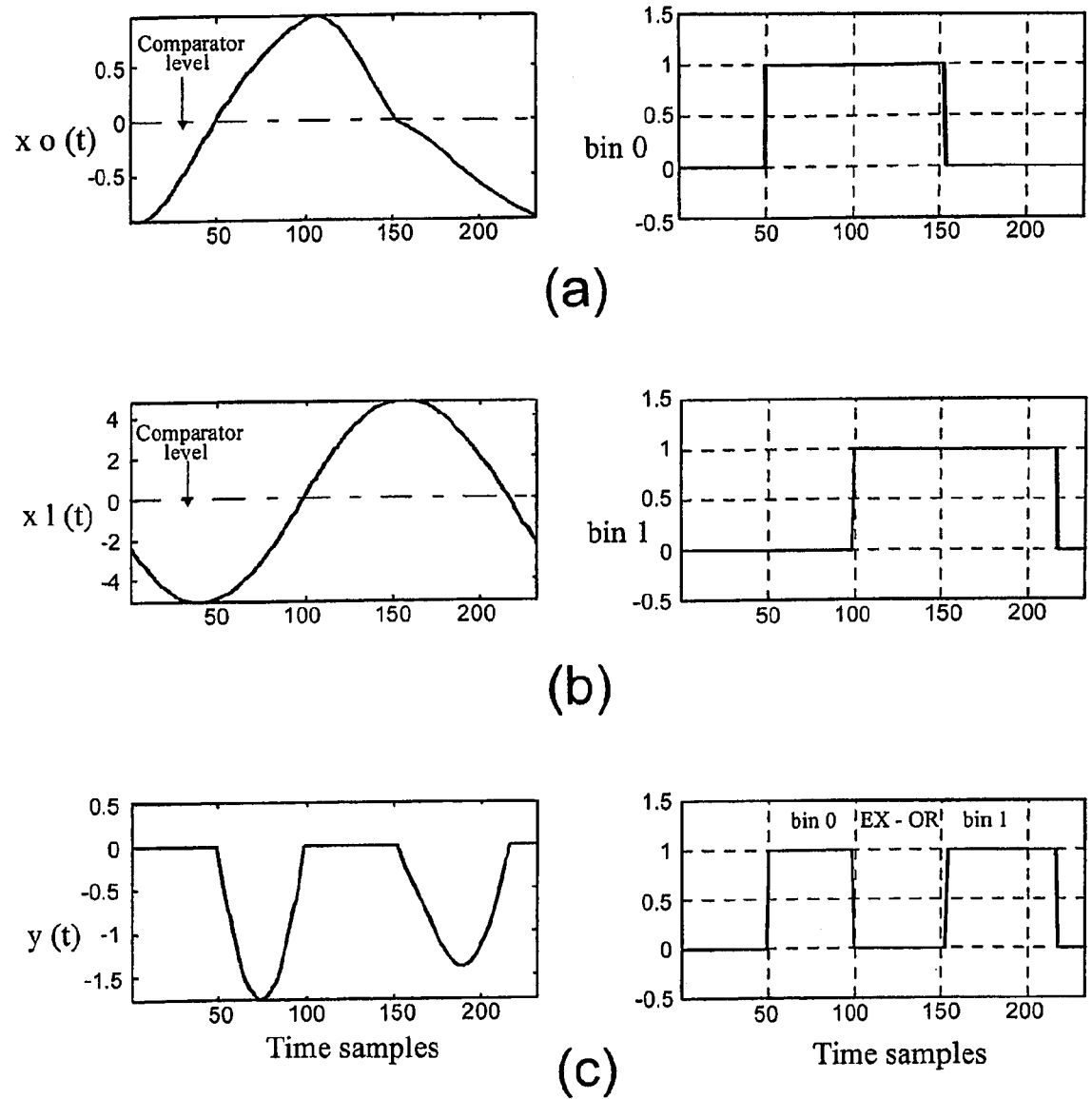
FIG. 3 shows various analogue signals and their digital responses for a fault free CUT and a faulty version thereof.

Assume that $x_0(t)$ and $x_1(t)$ are the analogue responses of a fault-free CUT and a faulty circuit, and y(t) is the negative part of their product. y(t) can be defined as follows: $y(t)=x_0(t)*x_1(t)$ for $x_0(t)*x_1(t)<0$, and $y(t)=0$ elsewhere. Since a negative product indicates a point in y(t) at which the fault-free response $x_0(t)$ and the faulty response $x_1(t)$ have different polarities, then y(t) is indicative of the number of time slots at which $x_0(t)$ and $x_1(t)$ differ in polarity. FIG. 3 shows examples of these signals. The polarity differences are related to the digital Hamming distance between the one-bit digitised responses of the good and faulty responses $x_0(t)$ and $x_1(t)$ respectively. Furthermore, they contain intermediate information that can guide the search for an optimum input signal.

The continuous AFM is a function of y(t) and can be expressed as follows:

$$AFM = \int_0^T y(t)dt$$

where T is the period of the steady state response. In the computer simulation, the continuous signals are sampled at discrete time intervals. The sampled AFM can then be described as:

$$AFM = \sum_{i=1}^{n} y(i)$$

where: $y(i)=x_0(i)*x_1(i)$ for $x_0(i)*x_1(i)<0$, i:1 to number of samples n and $y(i)=0$ elsewhere The DFM is the number of samples at which the product $x_0(i)*x_1(i)$ is negative. The AFM is the sum of the samples at which the product $x_0(i)*x_1(i)$ is negative and can be rewritten as:

$$AFM = \frac{DFM}{DFM}\sum_{i=1}^{n} y(i) = DFM\frac{\sum_{i=1}^{n} y(i)}{DFM} = DFM * NA$$

where NA is the sum of the negative values of the product y(i) divided by the number of these negative values, which is the DFM. This shows that there is a direct relationship between the AFM and the DFM. Furthermore, it shows that the AFM inherently includes the DFM.

Figure 2:
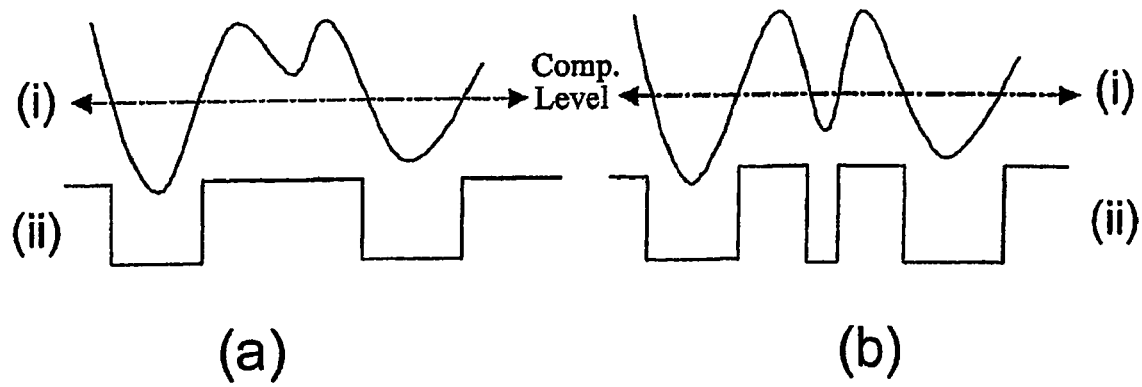
FIG. 2 shows various examples of analogue responses and their corresponding one-bit quantised responses, (a) before and (b) after the comparator in FIG. 1.

As will be appreciated from the above analysis, very small and very large values of y(t) have the same value of DFM making it vulnerable to noisy signals. In contrast, the AFM is relatively immune to noisy signals. In addition, in practice it is found that analogue information in effect guides the hill-climbing search for a test signal naturally towards an optimum solution. This is because the AFM takes account of sections where the signals approach the threshold. As shown in FIG. 2, the dip in the first analogue response is close to the comparator level. A small incremental change of the input binary sequence may pull this dip down and change the digital response, as shown in the second analogue response of FIG. 2, which may increase the Hamming distance. This directive information is not available in the digital responses. Consequently, the figure-of-merit should preferably be extracted from the analogue responses and should be directly related to the digital Hamming distance, which is used in the test application mode to identify faults. Hence, in the test development stage, the AFM is used as a measure of the effectiveness of a given binary sequence in detecting faults. However, after finding the optimum input sequence using the AFM in the test development mode, typically the DFM is calculated and used during the test application mode to identify faults.

Figure 4:
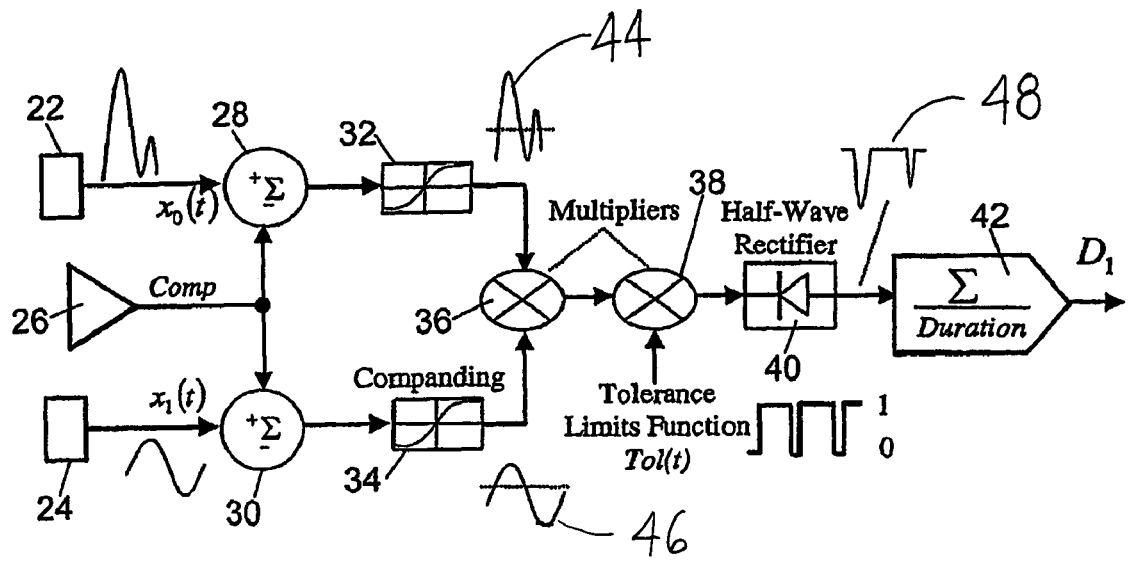
FIG. 4 is a block diagram of an arrangement for determining a figure of merit for a faulty circuit.

FIG. 4 shows an arrangement for detecting differences between a single faulty response and a good response using the AFM. This is a diagrammatic representation of methodology that is implemented in software. Hence, whilst it shows blocks of components such as multipliers and comparators, it will be appreciated that physical components are not used, but instead are modelled using computer-based software.

The arrangement of FIG. 4 includes an input 22 for receiving a signal from a good CUT, an input 24 for receiving a signal from a faulty CUT and a comparator 26. The comparator 26 threshold level is a DC voltage, based on which a comparison is made. During calculation of the figure of merit in the optimization procedure of the test development mode, multiple values for the comparator threshold are used and the one which yields highest figure of merit is selected. The comparator 26 threshold level is subtracted from each of the input signals at respective summers 28 and 30. If $x_0(t)$ is the nominal analogue response for the good CUT and Comp is the comparator threshold level, the signal of interest is the difference between them. This difference ($x_0(t)$–Comp) indicates whether $x_0(t)$ is greater than Comp or not.

When the difference (this difference is represented by the negative values of the product of two traces) between instantaneous amplitudes of the fault-free and faulty analogue response is sufficiently large to provide adequate discrimination, a procedure is carried out to prevent the figure of merit from increasing further at localised difference. This can be achieved by applying a function, for example a companding function 32 and 34, to each signal for preventing unnecessarily large differences in the output dominating the figure of merit during optimisation. The main requirement for this function are that the output should saturate at two different predetermined values (often –1 and +1) for extreme negative and positive values of input. In between these saturation regions, the function should increase monotonically, and hence be single-valued. An example of a suitable function is the sigmoidal function, which employs a non-linear squashing function based on the sigmoid or logistic equation. Low inputs are mapped to values near the minimum activation, and high inputs are mapped to values close to the maximum activation. Intermediate inputs are mapped non-linearly between the activation limits. It should be noted that the sigmoidal function is equivalent to the standard sigmoid function when activations range from 0 to 1 and the standard hyperbolic tangent function when activations range from –1 to +1.

Applying a sigmoidal function to the signal of FIG. 4 prevents domination of large differences in the output. This procedure avoids the optimisation increasing further any instantaneous values of difference in amplitude between the two analogue signals once that difference is sufficiently large to provide adequate discrimination. Otherwise the optimisation process might continue to increase these localised differences even further at the expense of establishing an adequate difference at other times within the same signals.

Figure 5:
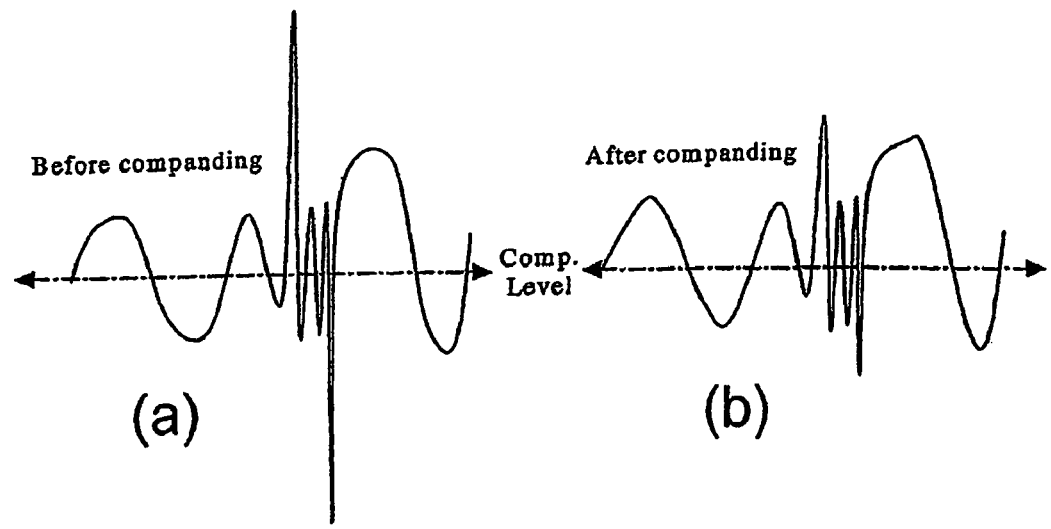
FIG. 5 shows the effect of applying a sigmoidal function to an analogue signal in the arrangement of FIG. 4.

The hyperbolic tangent function (tanh) is used as an example of the sigmoidal function, although other functions might be equally applicable. The nominal signal $xc_0(t)$ is then defined by:

$$xc_0(t) = \tan h\{[x_0(t) - \text{Comp}]/x_s\}$$

where $x_s$ is the input saturation level. For example, the level at which the actual comparator changes its output. This will prevent very small outputs dominating the figure of merit calculation. FIG. 5 shows an example of a nominal signal (a) before and (b) after the hyperbolic tangent function is applied. Of course, whilst these steps are described with reference to $x_0(t)$, which is the analogue response of the fault free CUT, they are also carried out for $x_1(t)$, which is the analogue response for the modelled faulty circuit. Hence, the nominal signal $xc_1(t)$ for the faulty CUT is also defined by:

$$xc_1(t) = \tan h\{[x_1t] - \text{comp}]/x_s\}$$

After being acted on by the sigmoidal function, the signals are then multiplied together at a multiplier stage 36. The product of the two signals is then acted on by a tolerance confidence function to take into account tolerances in the CUTS. In the present case, the tolerance confidence function is multiplied at 38 with the in-coming signal.

Figure 6:
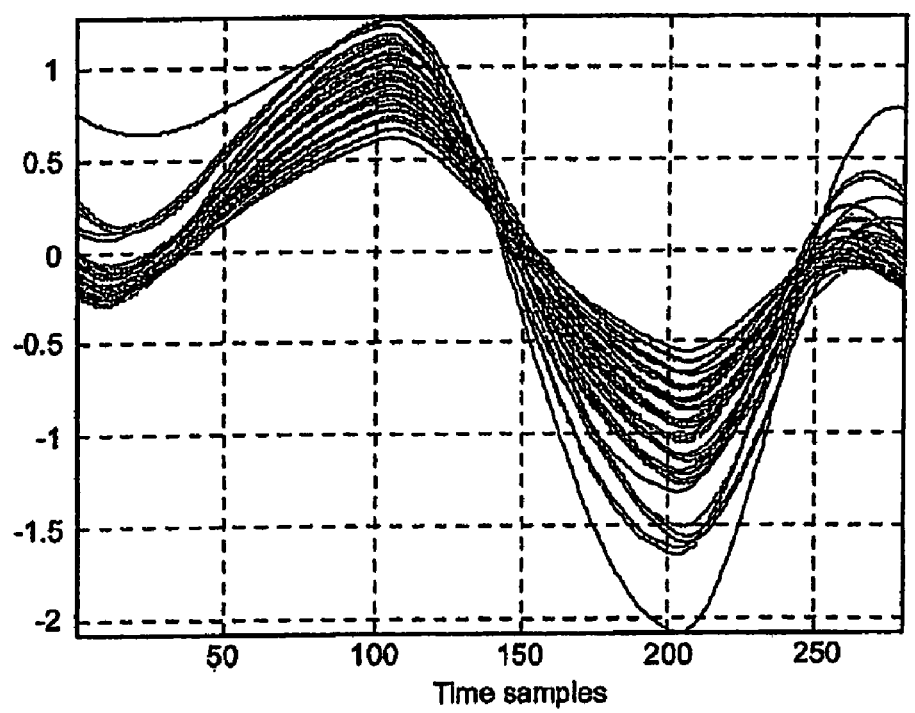
FIG. 6 shows various analogue responses due to tolerances within a test circuit.

Accounting for tolerances in analogue circuits is important, because the performance of each component can vary with certain tolerance band. This can result in a family of valid responses, as shown in FIG. 6. Any faulty response should be distinguished from all of these family members.

Figure 7:
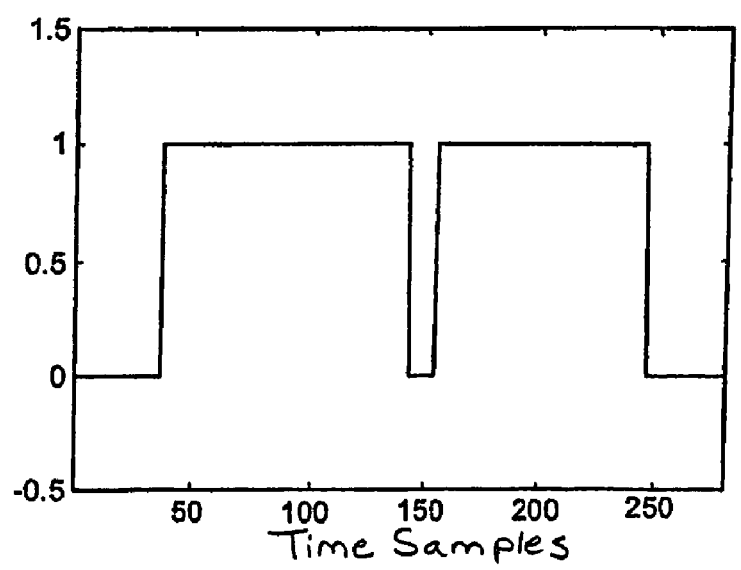
FIG. 7 is an example of the tolerance limits of FIG. 6.

In the actual test application mode, the analogue response is transformed to a digital response, which is equivalent to the crossings of the analogue response with the time axis, by comparing the analogue response with the comparator threshold level. The effect of tolerances has an impact on these crossings. Consequently, the spread of time-axis crossings due to tolerances is acceptable. Therefore, this spread in time-axis crossings is non-diagnostic and should be excluded from the evaluation of the figure of merit. The region of the spread of time-axis crossings due to tolerances at certain comparator level is defined by tolerance limits function Tol(t), where Tol(t) is zero in the tolerance region and unity anywhere else. FIG. 7 illustrates an example of Tol(t) with the comparator set to zero.

Figure 8:
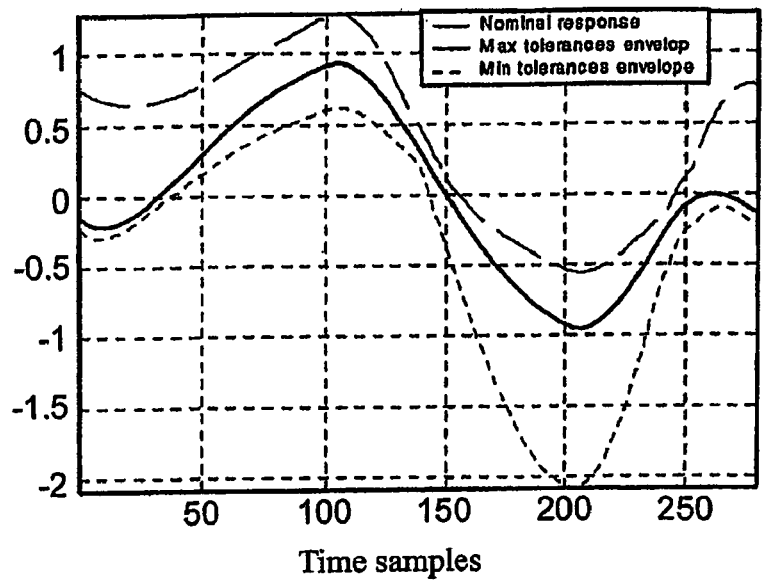
FIG. 8 shows the maximum, nominal and minimum envelops of the tolerance responses of FIG. 6.

The family of circuits due to tolerances is large and as will be appreciated increases as the number of components increase. Several methods are used to reduce the number of these circuits and to derive the tolerance limits function Tol(t) to be used in the final Figure-of-Merit. For example, the worst-case tolerances can be used to identify the upper/lower tolerance combinations, which correspond to max/min envelopes of the tolerance responses, as depicted in FIG. 8. Alternatively, sensitivity analysis can be used to identify the extreme combinations of worst-case tolerances. This analysis identifies the polarity of a component deviation such that the equivalent time-axis crossings are increased or decreased.

Once the signal of FIG. 4 is processed to take into account tolerances, it is then half wave rectified 40 to retain only the negative values, which values are indicative of the actual Hamming distance. Afterwards, the negative values are summed and normalised 42 by the number of the input signal samples. These negative values of the product of a good and a faulty response represent those time durations where a polarity difference exists between them. This is because if one of the two responses is positive and the other is negative then their product will be negative and if they are both positive or both negative then their product will be positive. Once time durations due to tolerances are removed from the product, the resulting negative values are diagnostic and provide an indication of how much the responses of the good and faulty circuits differ.

FIG. 4 provides a mechanism for determining the differences between a fault free and a single faulty circuit, thereby to establish a figure of merit. In practice, however, it is likely that CUTs have a range of potential faults and each CUT may include more than one of these. It is therefore important to have a figure of merit that is sensitive and robust enough to detect and identify any of that range of different faults in a given CUT.

Figure 9:
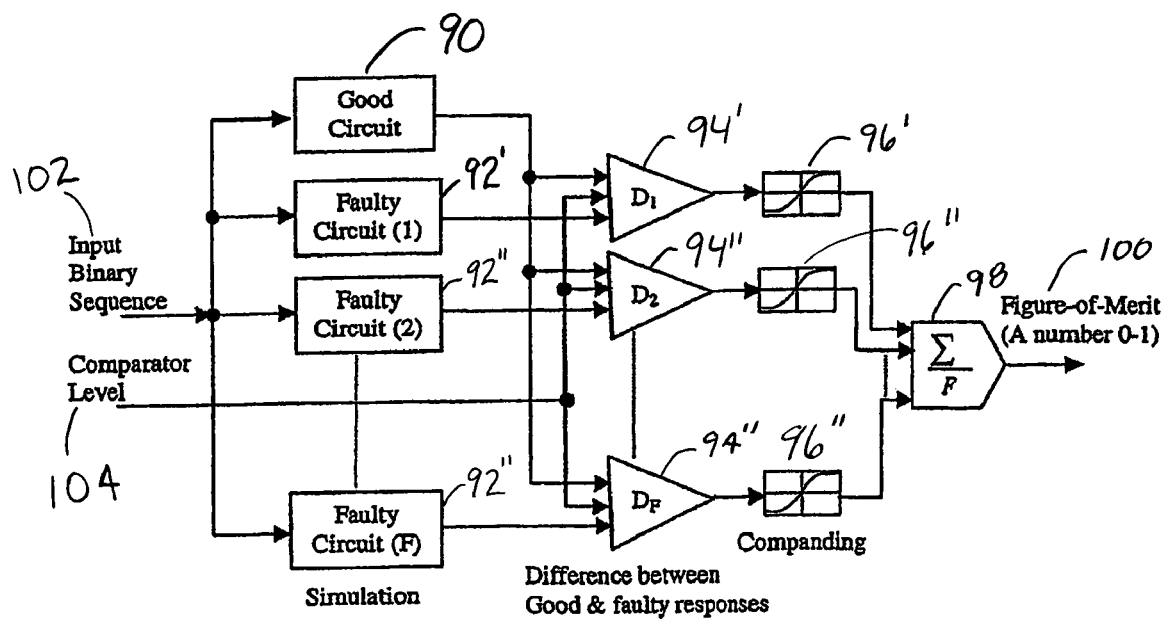
FIG. 9 is a block diagram of a system for measuring a composite figure of merit for a circuit that may have various potential faults.

FIG. 9 shows an arrangement for determining a figure of merit for an input signal to detect faults in a CUT. As for FIG. 4, this is a diagrammatic representation of methodology that is implemented in software. In the methodology of FIG. 9, the input signal is passed through a good CUT 90 to provide an ideal response and likewise through each of a plurality of modelled faulty circuits, each of the modelled faulty circuits having a known but different fault or combination of faults. The selection of the faults to test for depends on the nature of the CUT and the components used in it. Each of the resultant signals for the faulty CUTs is then processed as described with reference to FIG. 4 to provide a value $D_i$ that is a measure of the difference between the response of a faulty circuit $92_f$ and the response of a good circuit 90. The output of the differencing $94_f$ is then acted on by a sigmoidal function $96_f$, to prevent any given fault from dominating the overall figure of merit, to produce a figure of merit for each faulty CUT $92_f$. As before, any reasonable input-output function can be employed for this, the requirements being that the output should saturate at two different predetermined values for extreme values of input. In between these saturation regions, the function should preferably increase monotonically, and hence be single-valued. The hyperbolic tangent has worked well but other functions might be equally suitable. These figures of merit are then summed and divided by the number of modelled faulty CUTs at 98, thereby to provide a composite figure of merit.

For the arrangement of FIG. 9, if $x_i(t)$ is the $i^{th}$ faulty response, where, i=1 to F faults, then the difference $D_i$ between the $i^{th}$ faulty response and the valid responses is defined by:

$$D_i = \frac{1}{n}\sum_{j=1}^{n} d(j)$$

where, $d(j) = xc_0(j)*xc_i(j)*\text{Tol}(j)$ for $xc_0(j)*xc_1(j)*\text{Tol}(j) < 0$, and $d(j) = 0$ elsewhere and n is the number of samples of the input test-signal.

The ability to detect individual faults is combined into a single composite figure of merit. The individual figures of merit for each fault are most easily combined through summation, possibly weighted according to the importance of each fault and/or the expected probability of occurrence. If the figure of merit for each fault is acted on by the sigmoidal function before such combination, then the optimisation procedure will tend not to increase that individual figure of merit once it achieves the specified saturation level. Optimisation thus concentrates on achieving adequate performance over all faults rather than improving even further those faults, which are already adequately recognised.

In practice, the final figure of merit may be defined by:

$$\text{FoM} = -(1/F)*\text{sum}([\tan h(D_i/D_s)]), \text{ where i=1:number of faults } F$$

The hyperbolic tangent function (tanh) is used as an example of the sigmoidal function. The value of $D_s$ is different from $x_s$. $D_s$ is the value of the difference saturation level, and is chosen to ensure that more than an adequate measure of a fault does not contribute much more to the composite figure of merit (for example, after 20% measure of a fault difference, there will not be much more contribution to the composite figure of merit). It should be noted that the minus sign ensures a positive value of FoM, since individual differences are negative valued.

The figure-of-merit described above is immune to very large single fault differences. This is achieved by using the first sigmoidal function. It is also designed to prevent fault domination by using the second sigmoidal function with $D_s$. Hence, a well-detected fault does not contribute much more to the final figure-of-merit than an adequately detected fault.

The figure-of-merit described above can measure how well a digital input sequence can detect faults and its fault coverage, i.e. how many faults it can detect. Since each fault contribution is acted on by the sigmoidal function, it has a maximum contribution to the composite figure of merit of unity (before normalisation by the number of faults). Thus, the proximity of each fault contribution to unity indicates how well it has been detected. The proximity of the normalised (by the total number of faults) composite figure of merit to unity indicates how well all faults are detected and thus how many are not.

The figure of merit is normalised to a number ranges from zero to one. This allows the hill-climbing optimisation algorithm to develop by knowing in advance the maximum allowed value, which is unity. The figure of merit is also directly related to the Hamming distance, which is used in actual test circumstances.

Figure 10:
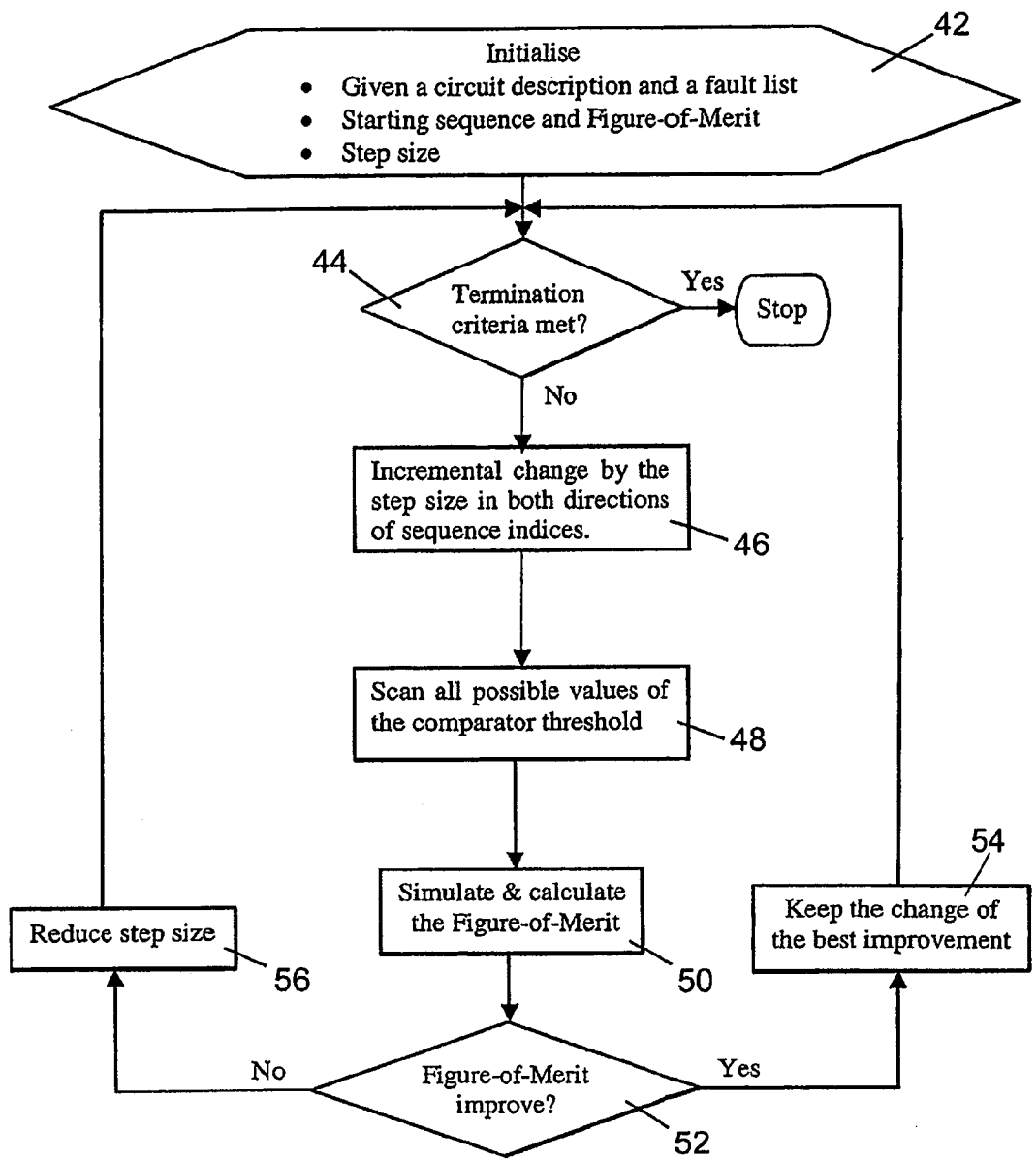
FIG. 10 is a flow diagram of an algorithm for optimising selection of an input signal.

The figures of merit, obtained in the manner described above, are used in the search algorithm in order to determine the optimum input sequence. The optimisation search can be considered a hill-climbing optimisation problem. A simplified flow chart of the algorithm is shown in FIG. 10. Before running the algorithm, it is necessary firstly to have a description of the CUT and a list of faulty circuits. To identify characteristic performances for a given input sequence, the fault free and modelled faulty CUTs are tested either using the circuit of FIG. 9 or modelled. The modelled behaviour can be provided, for example, using the well-known MALAB programming tool, which can generate input sequences, simulate CUTs and simulate output signals. As before, the modelled faulty circuits may include circuits that have faults on a single component/parameter or on multiple components/parameters, these faults being selected on the basis that they are the most likely to occur for a given circuit.

To optimise the input signal, the algorithm starts by identifying a good initial binary sequence that is either arbitrarily chosen or based on prior knowledge of the circuit 42. This is applied to the arrangement of FIG. 9 to determine the composite figure of merit for that input. One or more predetermined techniques are then applied to modify the initial sequence by, for example, varying the pulse width of at least one pulse in the sequence. Incremental changes are made in the timing of the transition points from high to low to give a number of potentially improved sequences 46. Each of these is then applied to the fault free and faulty CUTs. Once this is done, all possible values of the comparator threshold are scanned 48. For each threshold value, the figure of merit is determined 50, and the comparator threshold that gives the highest figure of merit is selected. The best comparator threshold is used to calculate the composite figure of merit for each input sequence, thereby to summarise its ability to detect the full range of faults. The input with the highest figure of merit is selected and retained 54. If this is the initial sequence then the algorithm terminates 44. If the selected sequence is not the initial sequence, then the algorithm starts again using the sequence with the highest figure of merit as the initial sequence. In this case, however, the size of the incremental change is varied 56. This process continues, with the step size being varied, until the selected sequence is the initial sequence, at which stage the algorithm terminates.

Given a CUT description, with component/parameter values, the frequency bandwidth of the CUT and a set of potential faults, which covers the most probable defects that may occur during the manufacturing process, the hill-climbing algorithm in effect sets out to search for and find an optimised set of binary sequences. Each sequence targets a group of faults, with associated comparator threshold level(s), to maximize the figure-of-merit and consequently the fault detection ratio. Variables include the integer run lengths of the binary sequences. This multidimensional problem may have more than one peak and the shape of its surface is completely unpredictable.

A more detailed description of the optimisation or search algorithm will now be given.

As will be appreciated, the response of a given CUT with faults differs from that of the fault-free circuit at certain frequencies. Consequently, the applied test signal should probably have more energy within these frequencies and be located at the part of the spectrum that is most sensitive to faults. Hence, to select good starting sequences, the search algorithm is operable to implement an exhaustive search examining all relevant binary sequences of limited lengths (i.e. number of bits) and different fundamental frequencies and selecting the most appropriate of these. Any binary sequence has two main properties, the length (i.e. number of bits) and the time duration, which is the reciprocal of the fundamental frequency of the sequence. If the number of bits is fixed and the time-duration of the bit is changed, then the whole sequence will be changed. For example, consider a binary sequence of 4 bits, one possible combinations of these bit is 1001. Then, the sequence 1001 with bit duration of 1 second is not the same as 1001 with bit duration of 2 seconds. The possible sequences of 4 bits are (e.g. 0000, 0001, 0011, 0010, 0111, 1001, and etc). If the bit duration is changed, each of these will result in another sequence. The total sequence duration (number of bits×bit duration, e.g. 4×1 second=4 seconds) is the reciprocal of the sequence fundamental frequency. If the length is fixed, then the frequency can have many values, and consequently many values of the bit durations. If the length and the frequency are fixed, then all possible combinations of the sequence bits (e.g. 0000, 0001, 0011, 0010, 0111, 1001, and etc) can be considered.

The best length, or the best frequency or the best combination of bits within a sequence is not known in advance. Therefore, the purpose of the exhaustive search is to find a sequence or more sequences of good performances. As the number of bits increases, the number of their possible combinations increases, e.g. for 32 bits, there may be $2^{32}$ combinations, which is about one billion sequences. So, the lengths, i.e. the number of bits, of the sequences considered is kept to a small number, so that all of their combinations can be evaluated. Multiple lengths with multiple fundamental frequencies are considered for the exhaustive search. For each frequency, for each length and for each possible sequence a figure of merit is determined.

More particularly, the exhaustive search involves selecting a number of frequencies covering the bandwidth of the CUT, which is in practice known, and generating a plurality of unlabelled binary sequences of small lengths, e.g. up to 16 bits. A first one of the selected frequencies is then selected and for every one of the plurality of binary sequences the bit duration is set to (1/length)×(1/frequency). Once this is done, a figure of merit is calculated for every unlabelled sequence of a given length. The sequence having a maximum figure of merit for that particular length and frequency is then determined. This is repeated for every length. Once this is done, the sequences having a maximum figure of merit for every length and one frequency are determined. The whole process is then repeated for the next frequency until all pre-selected frequencies are tested. Then, the sequences that have the maximum figures of merit for every length and all frequencies are determined. The number of obtained sequences is the number of lengths considered. In this way, a group of initial sequences can be determined.

It should be noted that to remove redundancy, sequences that are equivalent under rotation and/or inversion are not considered in the exhaustive evaluation. Since both input and output sequences are periodic, the choice of the starting position within the input sequence is arbitrary. This means that the rotation of a given binary sequence by any position in both directions will not change the effect of that binary sequence (1101 is the same as 1011). Furthermore, at least for linear circuits, inversion of a binary sequence provides no additional information (1000 is the same as 0111). Therefore, it is necessary to consider only those sequences that are non-equivalent under rotation and/or inversion.

The set of non-equivalent under rotation and/or inversion binary sequences are known in combinatorial mathematics as unlabelled binary necklaces. These are described in the article "Classes of Periodic Sequences" by Fine, Illinois J. of Math, Vol. 2, pp. 285–302, 1958. For example, the set of unlabelled necklaces of four bits is {0000, 0001, 0011, and 0101}. The number of unlabelled necklaces of number of 16 bits equals 2068. During initial investigations, the sequence length was sufficiently limited to 16 such that it would be possible to generate and then stimulate the CUT with all relevant sequences, which meet the predetermined constraints.

The exhaustive search can be summarised as follows:

```
-select number of frequencies covering the bandwidth of
the CUT
-generate unlabelled binary sequences of small lengths
(e.g. up to 16 bits)
-for every frequency
    for every length
        set bit duration to (1/length) × (1/frequency)
        for every unlabelled sequence of a given length
            calculate the Figure-of-Merit
        end
        find the sequence of maximum Figure-of-Merit
        (for particular length and frequency)
    end
    find the sequences of maximum Figure-of-Merit
    (for every length and one frequency)
end
-find the sequences of maximum Figure-of-Merit (for every
length and all frequencies)
// The number of obtained sequences is the number of
lengths considered //
```

Once the exhaustive search is completed and good starting sequences are identified, the algorithm is operable to carry out a local search. This is done using a direct-search optimisation strategy, such as the algorithm of Hooke and Jeeves [Hooke, R. and Jeeves, T. A.: "Direct Search Solution of Numerical and Statistical Problems", Journal of the Association for Computing Machinery, Vol. 8, pp. 212–229, 1961]. However, any other optimisation strategy could be applied. The local search can be considered an n-dimensional hill-climbing problem, in which each dimension corresponds to one runlength $R_i$ of the binary sequences.

Two distinct adjustments to the input sequence can be made, these being exploratory moves and pattern moves. Any binary sequence is a series of n runs $R_i$ with alternating polarities. Each run is the number of consecutive bits with same polarity. The transitions of polarity occur at time $$T_i, \text{ where } T_i = \sum_{i=1}^{n} R_i$$

Figure 11:
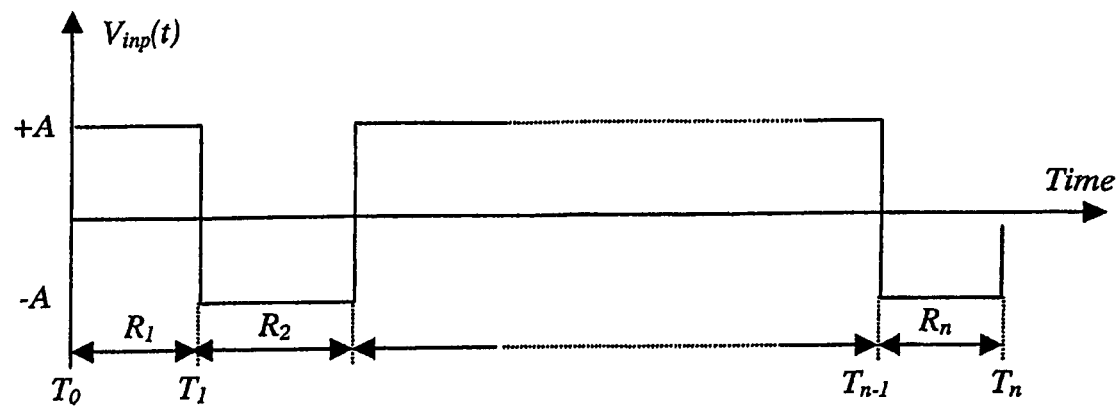
FIG. 11 is an example of a binary sequence of n runlengths.
Figure 12:
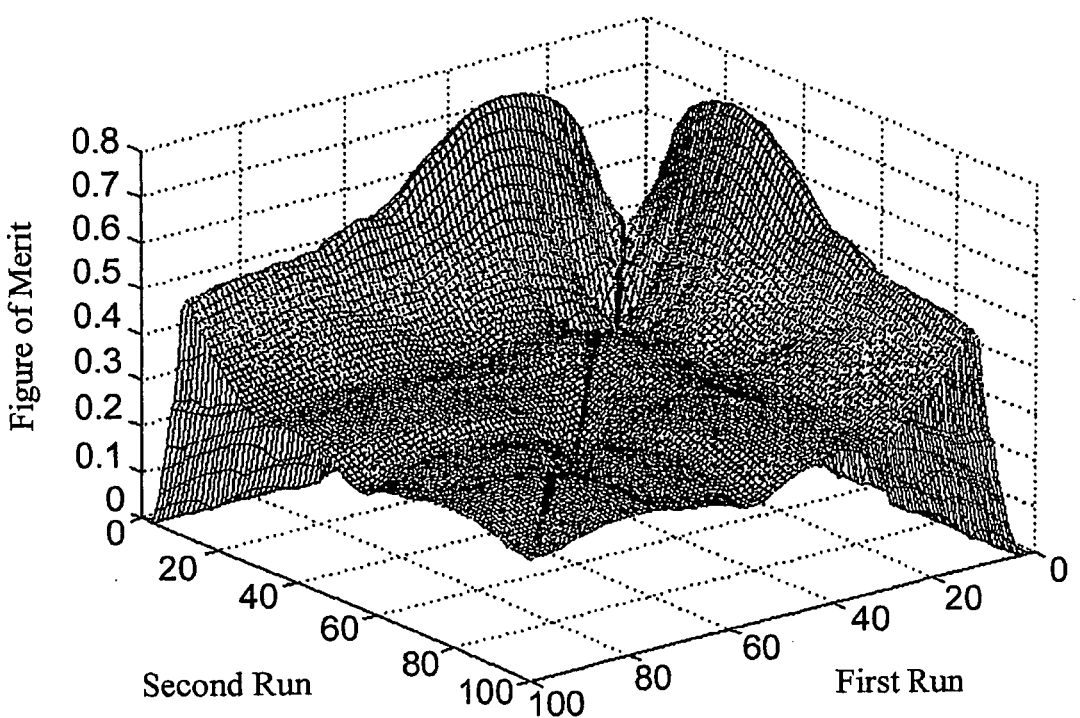
FIG. 12 is a 3-D representation of a hill-climbing surface that is generated using simplified sequences of only two runlengths (a high and a low pulses)

Assuming the amplitude of the input binary sequence is ±A, (although a non-symmetrical binary signal may be used), then this sequence can be described by the set of runs $\{R_1 R_2 \ldots R_n,$ where $R_i$ is an integer$\}$. FIG. 11 shows a binary sequence in which various runlengths $R_1$, $R_2$, and $R_N$ are shown. By varying the length of the runlengths for input sequences and calculating and optimising the figure of merit for each of these sequences, a hill-climbing search is conducted.

The local search algorithm starts with the initial binary sequence selected by the exhaustive search, for example $R^s = R_1, R_2 \ldots R_n$, where n is the number of runlengths. Each runlength is adjusted in turn by a fixed step $+\Delta R$. If increasing the first run length by $+\Delta R$ results in an increased figure of merit, the change is retained. If not, the first runlength is changed by $-\Delta R$. In the event that this change results in an increased figure of merit, then the change is retained. In contrast, if changing the first run length by $-\Delta R$ fails to improve the figure of merit, then $R^s$ is not changed. This is repeated for all runlengths of the sequence. After adjusting all runlengths $R_1 \ldots$ to $\ldots R_n$, if no new sequence is established, the step size is reduced and the exploratory moves are repeated. If a new sequence $R^{s+1}$ has been established, this is used as the new base point for a pattern move.

To implement a pattern move, the local search algorithm is operable to apply a shift function to the sequence that is output from the initial exploratory steps. A shift function moves the whole pattern in the search space, not a shift of the test sequence in time domain. For example, if R1=[5 5 10 10] and R2=[2 2 2 2], then a pattern shift of R1 by R2 may be as: R3=2R1−R2=[6 8 18 18]. More generally, the pattern move may be for example $R^{s+2} = 2R^{s+1} - R^s$, where $R^{s+2}$ is the result of the pattern move. Once the pattern is shifted to $R^{s+2}$, the exploratory steps described previously are repeated starting with $R^{s+2}$, that is the runlengths are each varied in turn in order to identify the sequence with the maximum figure of merit. If the exploratory steps fail to improve the figure of merit of $R^{s+2}$, $R^{s+1}$ is used as a starting sequence and the exploratory steps are conducted. If the exploratory steps succeed to improve the figure of merit of $R^{s+2}$, a new sequence $R^{s+3}$ will be established and $R^{s+3}$ & $R^{s+1}$ are considered for a further pattern shift to be applied. The algorithm repeats this process until the step size equals a pre-determined minimum allowed value. Alternatively, the local search could be continued until no further improvement occurs.

It should be noted that in the local search, if the step size is small, the algorithm is forced to search the nearby region, and may be stuck at a bad locale. If the step size is large, the algorithm may overlook a promising optimum. Therefore, using a variety of step sizes is recommended. The step sizes could be pre-determined or determined dynamically as the search progresses. Using several different step sizes when changing the signal incrementally could improve the probability of convergence, rather than changing the signal by the same amount each time. To improve the result of the local search, the obtained solution in one iteration is considered as a starting sequence for a new iteration of the local search. This process is repeated until no more improvement occurs. At the start of each iteration, the step size of the change is resumed to its initial value.

The local search can be summarised as follows:

```
=========================================================
Set s=0, an index for sequences
R^s = R_1 R_2...Rn, sequence of n runlengths (pulses)
While (better figure of merit) repeat
While (better figure of merit), repeat steps (1):(5)
    (1) //Exploratory moves//
        i=1
        (a) Adjust runlength R^s_i by a fixed step +ΔR to give
            R^s_—test.
        If (better figure of merit),
                        retain this change i.e R^{s+1} = RR^s_—test
                        and go to (b)
            Else, change R^s_i by -ΔR to give new R^s_—test
                If (better figure of merit),
                    retain this change i.e R^{s+1} = R^s_—test
                    and go to (b)
                Else, keep R^s unchanged i.e. R^{s+1} = R^s and go to
                (b)
        (b) i=i+1
        If i=n, go to (2)
        If i≠n, go to (a)
    (2) If a new vector has been established
            R^s = R^{s+1}
            i.e. use this new vector as the new base point for the
            pattern move and go to (4)
    (3) else (If a new vector has not been established)
            Vary the step size ΔR (unless it is already the
            minimum value, in this case exit inner while loop with
            best result), for example by reducing it, and repeat
            the exploratory moves i.e go to (1)
    (4) Pattern move:
        Move the pattern R^{s-1} by the result of the exploratory
        moves R^s using a predefined function to give R^{s+1}, for
        example, R^{s+1}=2R^s -R^{s-1}
    (5) make exploratory moves i.e. go to (1) with the new
    sequence obtained
    end the inner while loop
    end the outer while loop (terminate the algorithm)
=========================================================
```

Once the local search is completed, a local maximum in the figure of merit surface is identified. To optimise the search further, the algorithm is adapted to do a fine or neighbourhood search around this local maximum. The neighbourhood search involves applying positive and negative changes of unity step size in all indices of the input sequence and evaluating all possible combinations of changes. More specifically, the neighbourhood search starts by using the input sequence that corresponds to the local maximum identified by the local search. Fixed changes are then applied in all dimensions of the starting sequence simultaneously. This could for example involve changing every runlength in the sequence simultaneously by 1 to provide a first modified sequence and then changing every runlength in the sequence simultaneously by −1 to provide a second modified sequence and so on until all possible combinations of +1, −1 and zero are made. Once this is done, the figure of merit for all modified sequences is determined, and the sequence having the maximum figure of merit is retained. This process is repeated until no further improvement occurs, thereby guaranteeing that the obtained solution is the top of the local hill.

The neighbourhood search can be summarised as follows:

```
=========================================================
while improving
    -apply all possible combinations of (0, +1 and -1)
        changes in all dimensions of
        the starting sequence simultaneously
    -calculate Figure-of-Merit for all modified sequences
    -keep the sequence of max Figure-of-Merit
end
=========================================================
```

Once the neighbourhood search is completed, the local search process is then repeated for the next of the range of starting sequences, as is the neighbourhood search, so that the highest of the figures of merit is obtained for a variety of different input sequences. As will be appreciated, the shape of the hill surface is completely unpredictable. When the final sequence is analysed, the maximum composite figure of merit for all of the tested sequences is determined and the sequence that this corresponds to is identified as being the optimised signal. In some cases, once the signal is optimised, the entire process is repeated, but with well-detected faults removed from the tested fault list. This is done on the basis that well detected faults can be readily detected and so the optimisation should focus on those faults that are more difficult to identify. A second input sequence may be optimised exclusively for these difficult to identify faults.

Figure 18:
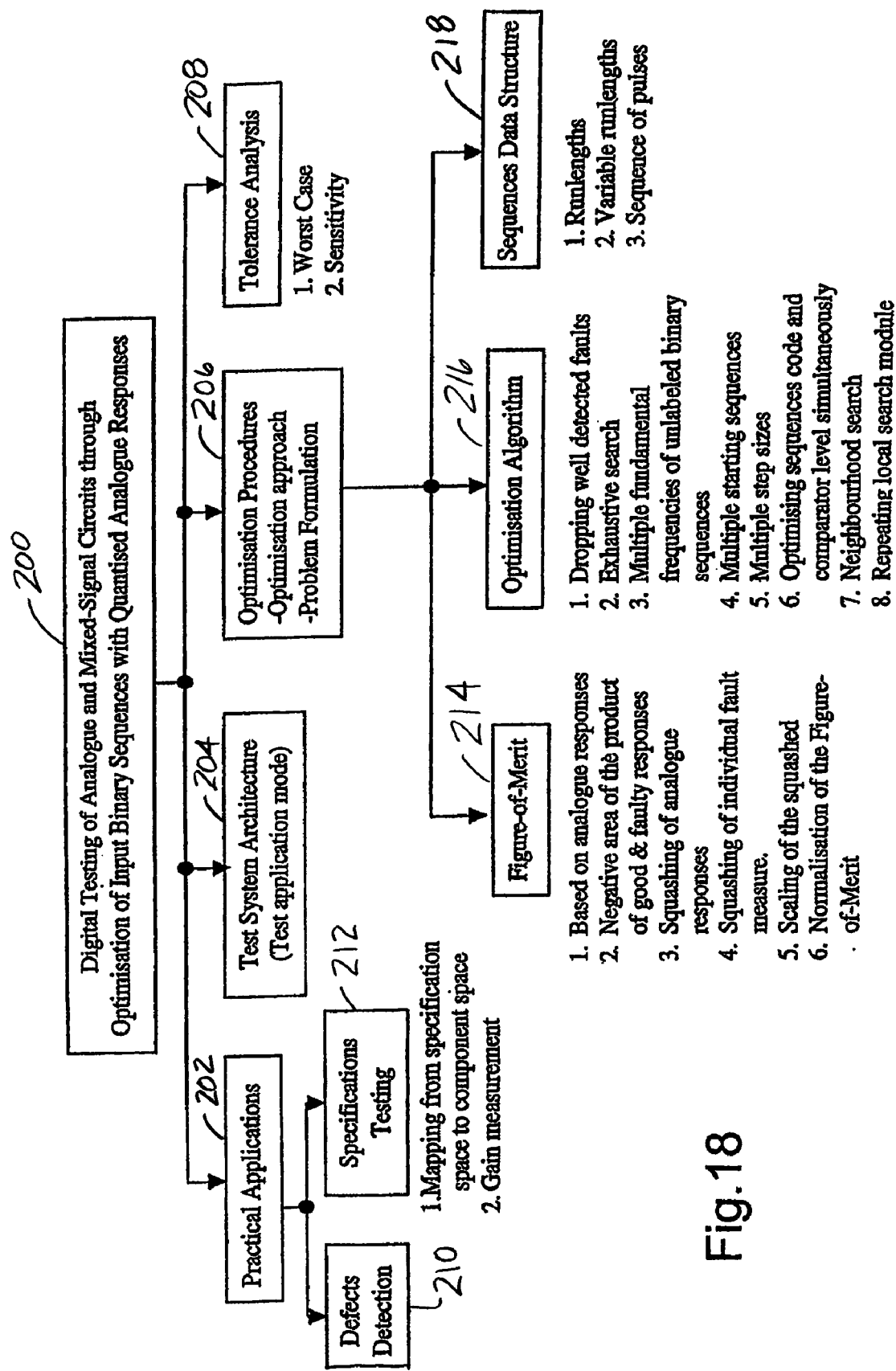
FIG. 18 is a chart that summarises the overall features of the optimisation technique and test method.

The main features of the test method and the optimisation algorithm described herein are summarised in FIG. 18. The algorithm provides a robust and effective method for identifying an optimal digital test signals for an analogue or mixed signal circuit. It uses a coarsely quantised exhaustive search to find good starting sequences on the figure-of-merit hill. Once this is done, a local search is conducted during which the runlengths of the input sequences are varied using several different initial step sizes, thereby to improve the probability of convergence. This is repeated until no further improvement occurs. A neighbourhood search is then done on the output of the local search by applying zero and ± change of unity step size in all indices of the input sequence and evaluating all possible combination of changes. This is done to guarantee that the top of a local hill can be identified. Well-detected faults are then identified and dropped and the whole process is repeated for the remaining faults. This is because it is unlikely to have one sequence that detects all faults.

Figure 17:
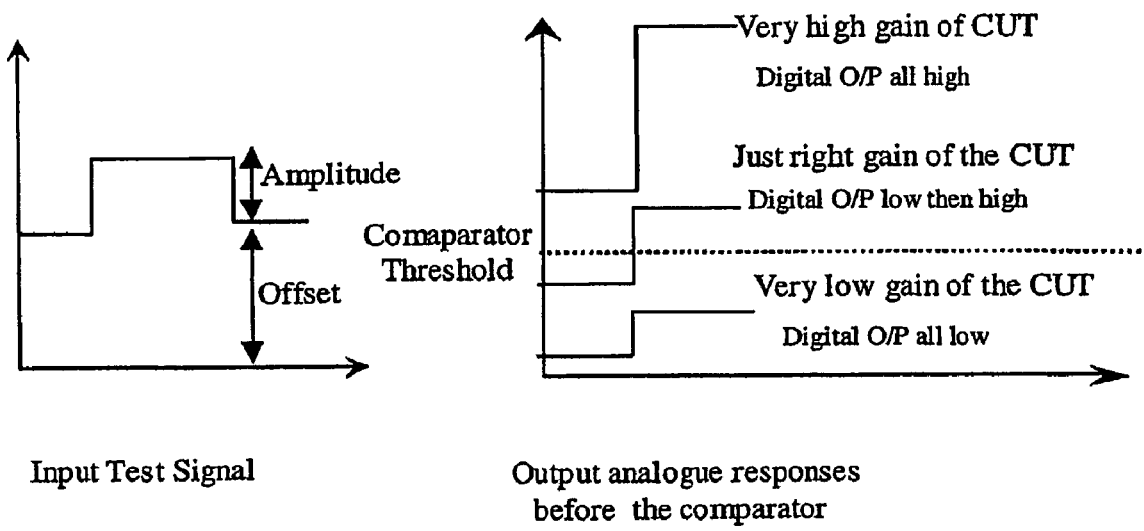
FIG. 17 shows an example of a test signal and its responses for gain measurement of a CUT.

An enhancement to the methodology presented herein provides a solution to the tricky problem of measuring the gain of a CUT. However, it does not require optimisation. For a dc CUT, in which the frequency of the input test signal has no effect on the behaviour of the CUT, the input signal offset and amplitude can be found by calculation, or iterative binary chop similar to successive approximation analogue-to-digital conversion. For ac coupled circuits, in which the behaviour of the CUT is dependent on frequency, the mark space ratio of the input digital signal can be adjusted to set the dc offset and the gain is adjusted as before. The input offset and amplitude are selected such that for a low gain, the whole output signal is below the threshold. In the event that the gain is too high, the whole output is above the threshold and only when the gain is within the correct range is the threshold crossed by the output as per the example in FIG. 17.

Figure 13:
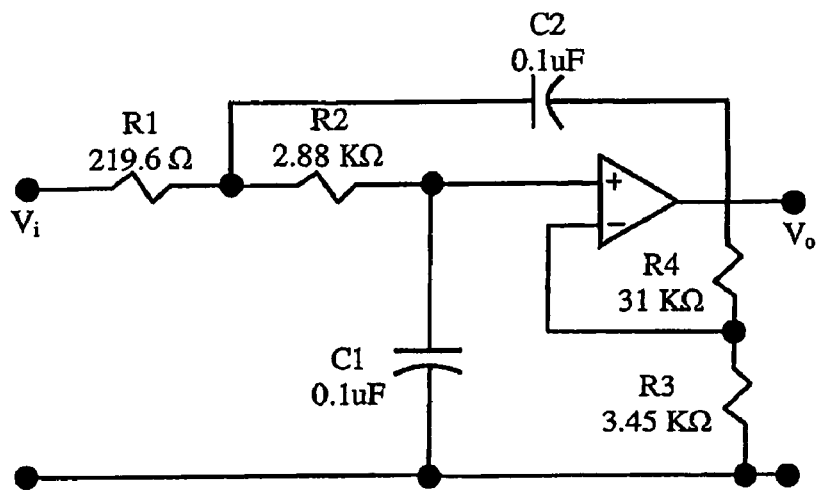
FIG. 13 is a circuit diagram of a low pass filter.
Figure 14:
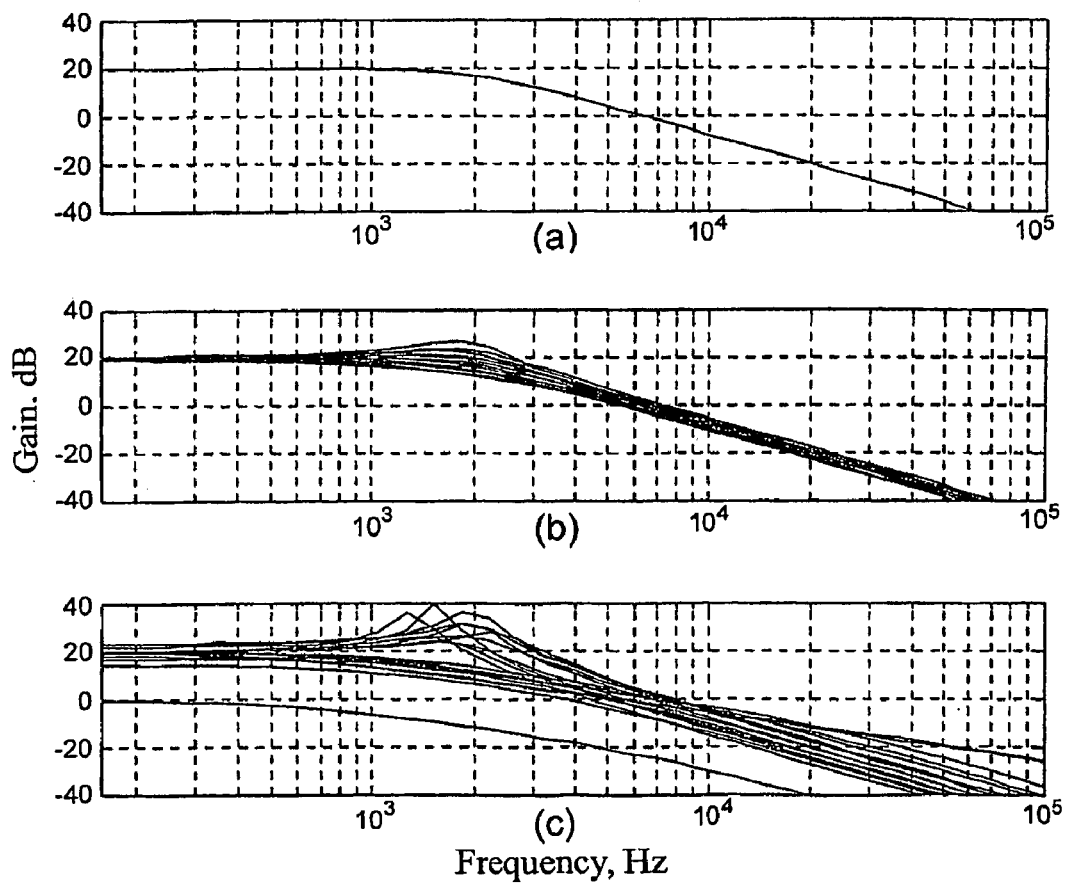
FIGS. 14(a) to (c) show the frequency responses for a fault free version of the filter of FIG. 13, various different versions of the circuit of FIG. 13, but within tolerance ranges and different faulty versions of the circuit of FIG. 13.

In order to test the method in which the invention is embodied, a second-order Sallen-Key active low pass filter (LPF) having a cut-off frequency of 2 KHz (Kilo Hertz) was selected. An example of this is shown in FIG. 13. The gain bandwidth product of the operational amplifier was assumed to be 10 MHz (Mega Hertz). Various faults including parametric deviation, open, and short-circuits were considered for simulation. The values of faults were chosen to satisfy the stability condition of the LPF. The MATLAB programming tool was used for input sequence generation, circuit simulation and output processing. FIG. 14 shows the frequency response of the three cases: (a) fault-free, (b) worst case tolerances and (c) 22 faulty circuits. It is clear from this that the region at which most of the faults have the greatest difference from that of the fault-free response is around the cut-off frequency. Thus, the optimum stimulus is likely to have most of its power concentrated at those frequencies around cut-off.

The binary sequence for stimulating the CUT was identified through the optimisation algorithm. For the sake of simplicity, the components tolerances were not included. However, they can be easily incorporated in the calculation of the composite figure of merit. Setting the comparator of the test system at zero threshold, it was found that the binary sequence of the maximum value of the composite figure of merit had the following characteristics:

Number of bits=53.

Bit duration or clock interval=10 μSec.

Runlength of [+34 −11 +5 −3], where the sign is the polarity and the associated number is the runlength (the number of consecutive bits of same polarity).

The oversampling ratio was chosen to be unity. The optimised input sequence was repeated until the output voltage of the CUT settled. The settling time should be larger than the slowest settling time of the faulty circuits. For this particular circuit and set of faults, the settling time was less than 10 ms (milli second).

Figure 15:
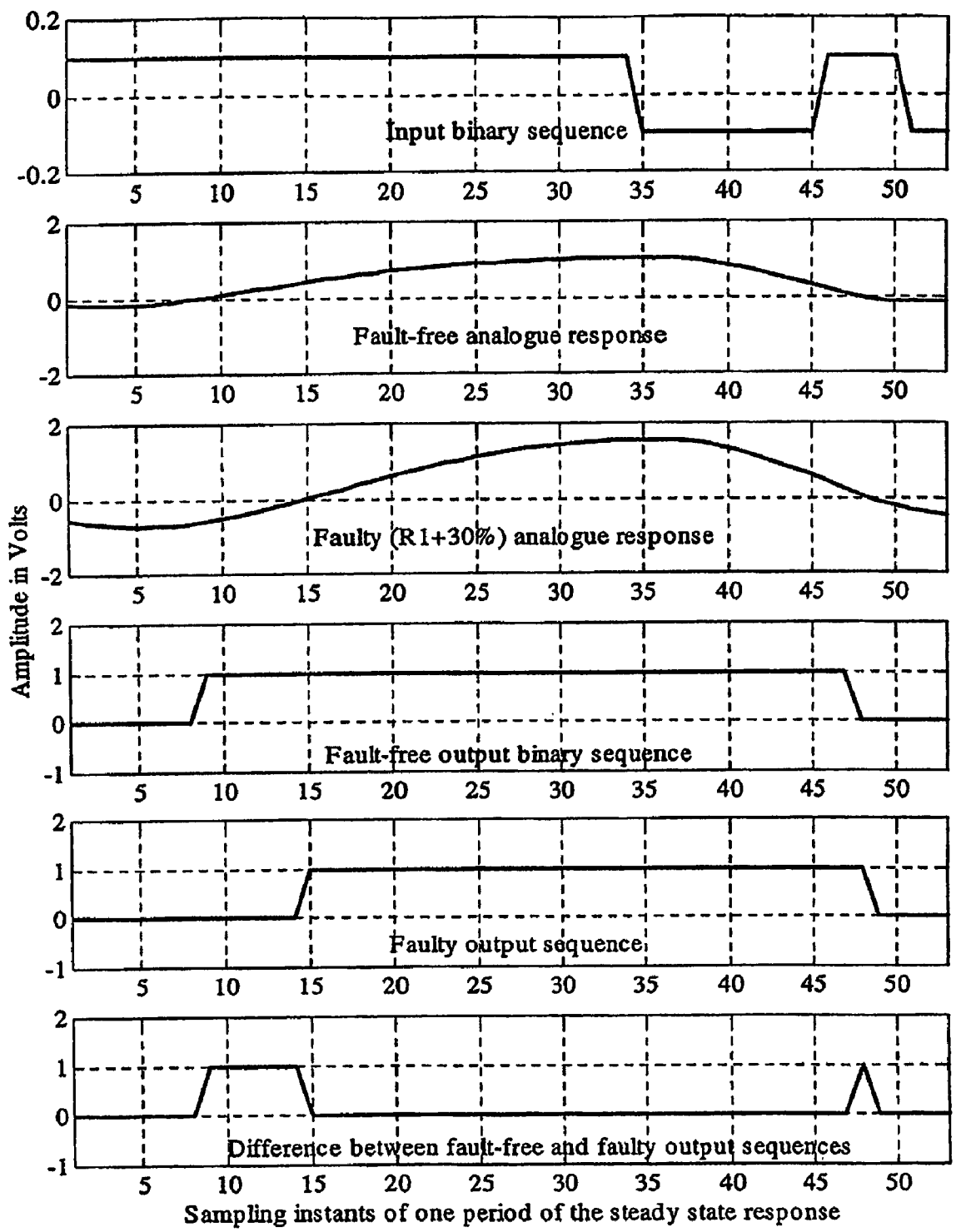
FIG. 15 shows various waveforms for fault free and faulty versions of the circuit of FIG. 13 (without tolerances)
Figure 16:
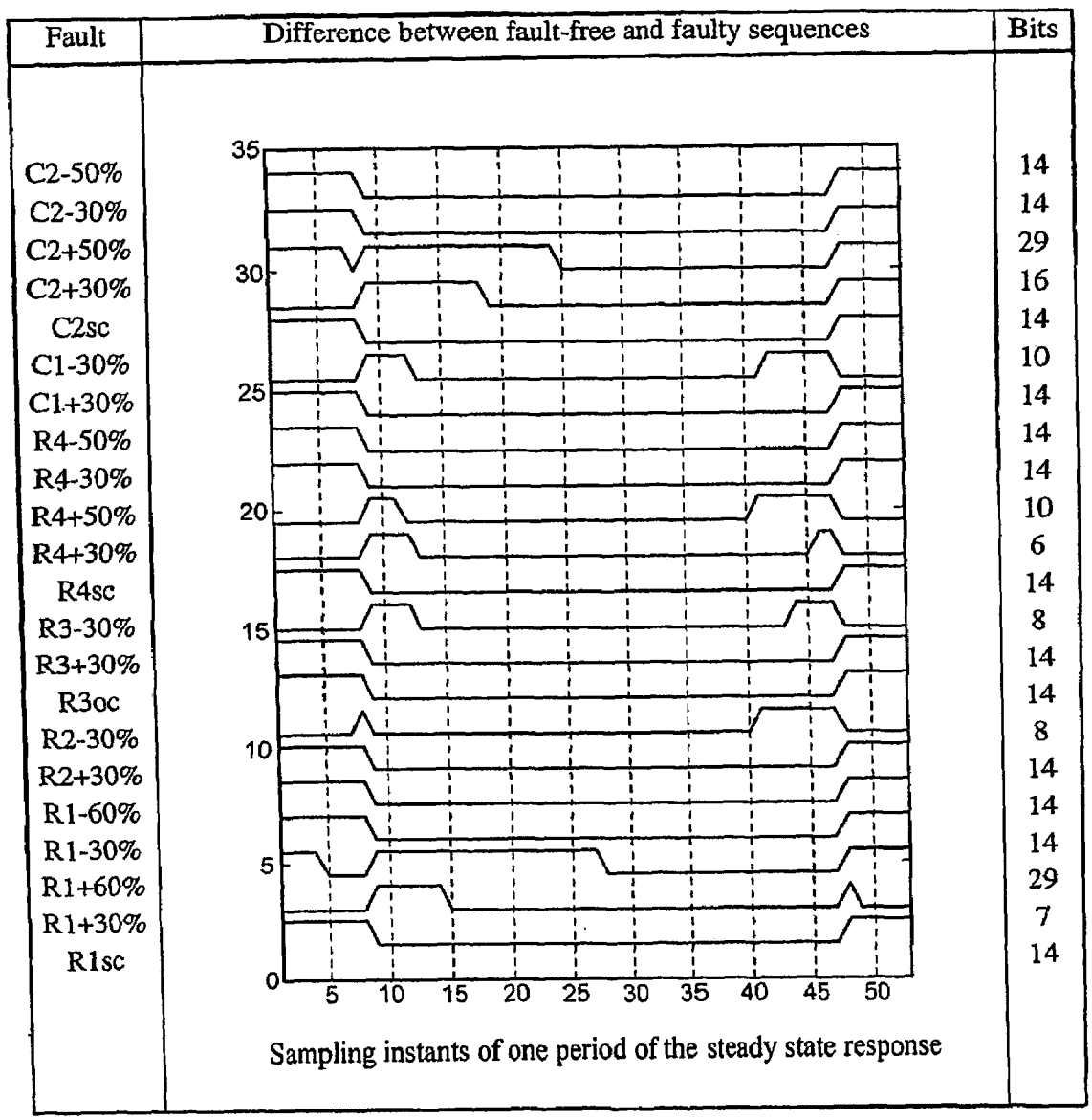
FIG. 16 shows a table of simulation results for the filter of FIG. 13, also without tolerances.

The optimised input binary sequence stimulated all the CUT configurations. The output analogue responses were then one-bit quantised by the output comparator with reference at zero. The resulting faulty binary sequence was then compared against the sequence of the fault-free CUT. FIG. 15 shows the simulation results for one fault (R1+30%) as time domain responses. FIG. 16 shows a table of simulation results for all 22 considered faults, where the Hamming distance for each fault is shown graphically and numerically. FIG. 16 shows that the timing of the output binary sequence is affected by the presence of a fault in the CUT. In FIG. 16, the timing comparison is made against that of an ideal fault-free CUT (all components are in their nominal values). However, in practice this is not the case. Differences in some timeslots due to components tolerances are non-diagnostic and should be excluded from the evaluation. From FIG. 16, it can be seen that most of the faults could be detected.

According to the invention, there is provided a method for optimising a digital test signal for testing analogue or mixed-signal circuits and a method for using the optimised signal to test analogue and/or mixed-signal circuits. Numerous advantages are provided by the invention. For example, it provides robust testing with wide fault coverage, including parametric failures. Because of the efficiency of the testing, the method also allows rapid device throughput. The method is also suited to integrated circuit testing where routing analogue test signals is problematic. In addition, the method can be implemented using minimal on-chip overhead and cheaper, digital, external test equipment. Furthermore, minimal time is needed to design the test procedure. The skill level required by the test procedure designer is reduced and the process could be fully automated. There is also scope to include test and verification circuitry on-chip giving complete built in test capability. Additionally, there is a reduced demand for expensive test equipment. Yet another advantage is the reduction of the hardware needed for stimulus generation and response processing in the test application mode to a single comparator and some comparison logic. This greatly simplifies testing and increases manufacturing throughput.

Figure 19:
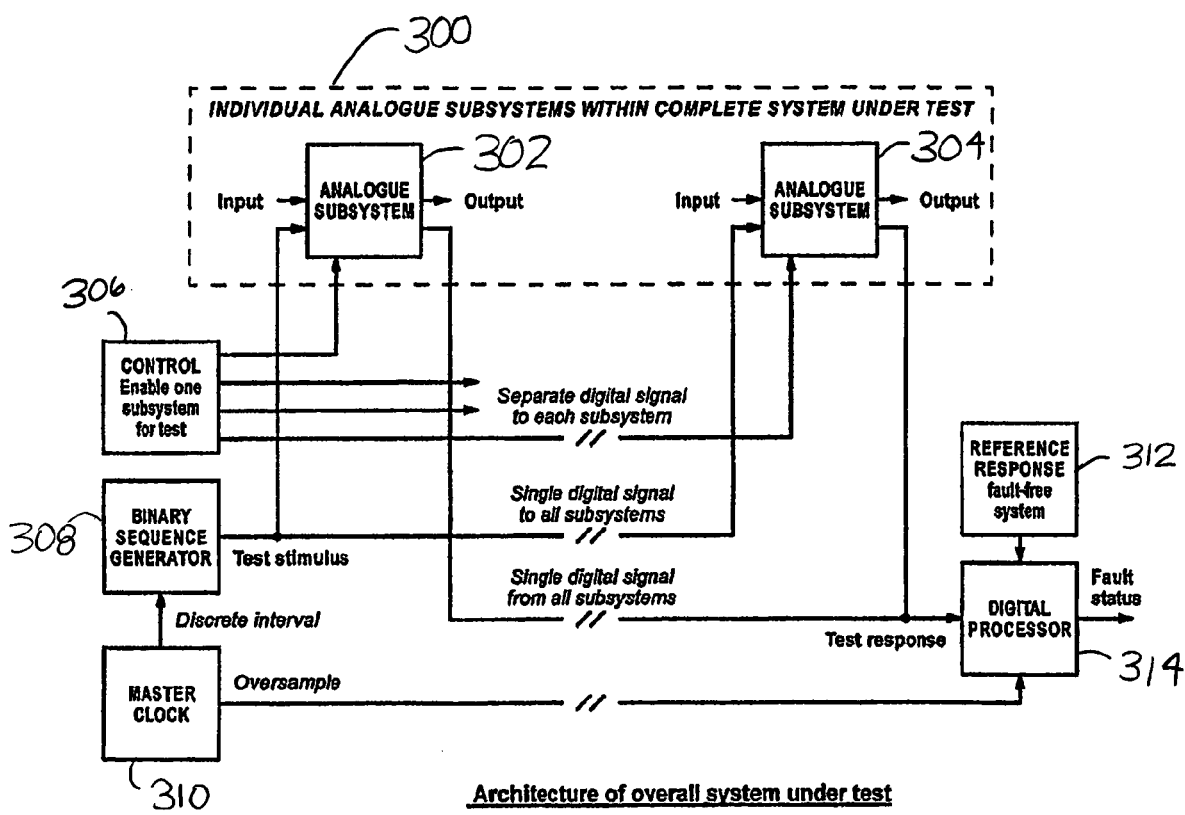
FIG. 19 is a modified version of a test circuit for testing a plurality of sub-systems using a single digital source.

A skilled person will appreciate that variations of the disclosed arrangements are possible without departing from the invention. In particular, whilst the search or optimisation algorithm is described as being a hill-climbing algorithm, other suitable techniques could be used. For example, techniques from artificial intelligence could be employed for optimisation. This is equivalent to searching for best examples within constraints. Evolutionary computing techniques such as genetic algorithms may also be useful. In a simple sense, such approaches do not have specific rules for modification and may have an element of random change. Frequently a large population of candidates is maintained concurrently. These techniques do not have formal algorithms and take advantage of the increased power, i.e. memory and execution speed of modern computers. In addition, whilst in the examples described a simple two state input signal is investigated, it will be appreciated that other more complex inputs could be used. Additionally or alternatively, the simulations could be adapted to take into account the rise time of the digital signal when it switches between digital states, so that the real time behaviour of the circuit can be modelled more accurately. Furthermore, as a modification to the test system described above, it will be appreciated that a single digital input source could be used to test a plurality of different electronic functions or subsystems having inputs that are connected to a single interconnected. To do this, the arrangement shown in FIG. 19 could be used. This allows a single test signal to be sequentially applied to each of the analogue sub-systems. Alternatively, a single test signal can be applied to a selected one of the circuits. In any case, a single detector is provided for analysing the resultant outputs. By sharing functionality in this way, the size and cost of the test arrangement can be minimised. Accordingly, the above description of a specific embodiment is made by way of example only and not for the purposes of limitation. It will be clear to the skilled person that minor modifications may be made without significant changes to the operation described above.

The invention claimed is:

1. A method for improving digital testing of an analogue or mixed-signal circuit, the method comprising:

inputting a digitized input test sequence to a fault free version of the analogue or mixed signal circuit or computer simulation thereof;

inputting the same digitized input test sequence to a version of the circuit or computer simulation thereof that has at least one specified fault, using an optimization algorithm to vary the input test sequence;

monitoring the outputs of the fault free and faulty circuits for each test sequence; and identifying an optimized digitized input test sequence, wherein the optimized digitized input test sequence is used to identify a corresponding digitized output for use in a test mode.

2. A method as claimed in claim 1 comprising for each input, determining a measure that is indicative of differences between the output of the fault free circuit and the output of the known faulty circuit in response to the digitized input test sequence and selecting an improved input digitized test sequence based on the determined measures for all of the sequences.

3. A method as claimed in claim 1, wherein varying the initial digitized input test sequence is done according to pre-determined criteria.

4. A method as claimed claim 3, wherein the step of varying the initial digitized input test sequence involves changing the length of one or more individual pulses in the sequence.

5. A method as claimed in claim 4, wherein the length of individual pulses is varied by the same amount or by increasingly large or small amounts or by different amounts, which different amounts may be selected randomly or according to predefined criteria.

6. A method as claimed in claim 5, wherein the length of all of the pulses is varied by the same amount in sequence one after the other.

7. A method as claimed in claim 5 further involving changing the size of the amount by which the pulse lengths are varied and repeating the process of varying.

8. A method as claimed in claim 3, wherein varying the digitized input test sequence involves inputting a pre-determined function to the initial input sequence, which function modifies simultaneously all pulses in the digitized input test sequence at once.

9. A method as claimed in claim 1 comprising inputting a range of different initial digitized input test sequences, each of these being varied according to pre-determined criteria to find a local optimum for each initial input.

10. A method as claimed in claim 9 comprising comparing all of the local optima and selecting the optimum signal.

11. A method as claimed in claim 1, wherein the monitored outputs for each of the fault free circuit and the known faulty circuit are analogue outputs.

12. A method as claimed in claim 11 comprising processing the analogue outputs to prevent domination of large differences in the output prior to selection of the digitized input test sequence.

13. A method as claimed in claim 12, wherein processing the analogue signals involves using a function having an output that saturates at two different predetermined values for extreme negative and positive values of input.

14. A method as claimed in claim 13, wherein the function is a sigmoidal function, which employs a non-linear squashing function based on the sigmoid or logistic equation, wherein the sigmoidal function is a hyperbolic tan function.

15. A method as claimed in claim 1, wherein digitized outputs from the fault free and the faulty circuits are used to determine the optimum digitized input test signal.

16. A method as claimed in claim 1 further comprising using a fault detection ratio to determine the digitized input test sequence, the fault detection ratio being defined as the proportion of a set of predefined faults that can be detected according to a set of criteria for fault discrimination.

17. A method as claimed in claim 16, wherein the fault detection ratio is the Hamming distance between the digitized output response for the fault free circuit and the digitized output response for the faulty circuit.

18. A method as claimed in claim 17, wherein the figure of merit is proportional to or a function of the Hamming distance.

19. A method as claimed in claim 1 comprising using a pre-determined group of possible digitized input test sequences to find one or more good initial or starting digitized input sequences.

20. A method as claimed in claim 1, wherein rather than optimizing the digitized input test sequence based on known faults, the signal is optimized to take into account variations in values of functional specifications.

21. A method as claimed in claim 1, wherein the using an optimization algorithm uses an optimization algorithm that is selected from at least one of a hill climbing algorithm and a genetic algorithm.

22. A digitized input test sequence or a copy thereof for testing analogue or mixed signal circuits that is a product of:
    inputting a digitized input test sequence to a fault free version of the analogue or mixed signal circuit or computer simulation thereof;
    inputting the same digitized input test sequence to a version of the circuit or computer simulation thereof that has at least one specified fault,
    using an optimization algorithm to vary the input test sequence;
    monitoring the outputs of the fault free and faulty circuits for each test sequence; and
    identifying an optimized digitized input test sequence, wherein the optimized digitized input test sequence is used to identify a corresponding digitized output for use in a test mode.

23. A method for testing analogue and/or mixed-signal circuits using a digitized sequence, the method comprising:
    inputting to the circuit under test an optimized digitized test sequence as claimed in claim 22;
    comparing a digitized output of the circuit under test with an expected digitized output for a fault free circuit; and
    determining a fault based on a result of the step of comparing.

24. A method as claimed in claim 23, wherein the output from the circuit under test and the expected output are analogue, and the method further involves digitizing the output of the circuit under test wherein the expected output for the fault free circuit includes an acceptable tolerance range for the optimized input test sequence.

25. A method as claimed in claim 23, wherein the expected output for the fault free circuit includes an acceptable tolerance range for the optimized digitized input test sequence.

26. A method as claimed in claim 23 further comprising storing outputs for one or more known faults for the optimized digitized test sequence and comparing an output from a circuit under test with these.

27. A method as claimed in claim 26, wherein the stored outputs for the one or more known faults include an acceptable tolerance range for the optimized digitized input test sequence.

28. A method as claimed in claim 23 wherein in the event that a gain of the circuit is to be tested, the digitized input test sequence has an optimized offset voltage and/or amplitude.

29. A system for testing analogue and/or mixed-signal circuits using a digitized input test sequence, the system comprising:
    means for inputting to the circuit under test an optimized digitized input sequence as defined in claim 22;
    means for comparing an output signal of the CUT with an expected output signal for a good circuit; and
    means for determining a fault based on an output from the means for comparing.

30. A system as claimed in claim 29, wherein the outputs from the CUT are analogue, and means are provided for digitizing the outputs of the circuit under test.

31. A system as claimed in claim 29, wherein the means for inputting comprises a single sequence generator is provided for stimulating a plurality of different electronic functions or sub-systems.

32. A system as claimed in claim 29, wherein the means for determining a fault comprises a single detector that is operable to analyze outputs from each of the plurality of different electronic functions or sub-systems.

33. A computer program for use in a method of testing an analogue or mixed-signal circuit using a digitized input test sequence, the computer program being provided on a data carrier or computer readable medium and having code or instructions for:
   inputting to a circuit under test an optimized digitized test sequence as defined in claim 22;
   comparing an output signal of the circuit under test with an expected output signal for a good circuit; and
   determining whether there is a fault based on an output from the instructions for comparing.

34. A computer program as claimed in claim 33 having code or instructions for storing a measure for a circuit having a known fault and comparing the measure for the circuit under test with that for the known fault.

35. A test system that includes means for generating an optimized digitized test input sequence as defined in claim 22, means for inputting the digitized input test sequence to an analogue or mixed-signal circuit under test, means for comparing an output signal of the circuit under test with an expected output signal for a known circuit which is also stored or generated locally, and means for determining a fault based on an output from the means for comparing.

36. A test system as claimed in claim 35 that is provided on the same chip as the circuit under test.

37. An electronic device that includes a test system that has means for generating an optimized digitized input test signal as defined in claim 22 means for inputting the digitized input test sequence to an analogue or mixed-signal circuit under test, means for comparing an output signal of the circuit under test with an expected output signal for a good circuit, which is also stored or generated locally, and means for determining a fault based on an output from the means for comparing.

38. A system for improving digital testing of an analogue or mixed-signal circuit, the system being configured to:
   input a digitized input test sequence to a fault free version of the analogue or mixed signal circuit or computer simulation thereof;
   input the same digitized input test sequence to a version of the circuit that has at least one specified fault;
   use an optimization algorithm to vary the input test sequence;
   monitor the outputs of the fault free and faulty circuits for each test sequence and identify a digitized input sequence, wherein the digitized input is used to identify a corresponding digitized output for use in a test mode.

39. A system as claimed in claim 38 operable to determine a measure that is indicative of differences between an output of the fault free circuit and an output of the known faulty circuit in response to a digitized input test sequence, and select the optimum digitized input test sequence based on the measures determined for each digitized input test sequence.

40. A system as claimed in claim 38 operable to input an initial digitized input test sequence and then vary the digitized input test sequence according to pre-determined criteria.

41. A system as claimed in claim 40 operable to vary the initial digitized input test sequence by changing the length of one or more individual pulses in the digitized input test sequence.

42. A system as claimed in claim 41 operable to vary the pulse length by one of the same amount; an increasingly large amount; an increasingly small amount, and different amounts, which different amounts are either selected randomly or by predefined scheme.

43. A system as claimed in claim 38, wherein the system is operable to vary the frequency of the digitized input test sequence using the optimization algorithm.

44. A system as claimed in claim 38, wherein the system is operable to monitor analogue outputs from the fault free and faulty circuits.

45. A system as claimed in claim 38, wherein the system is operable to monitor digitized outputs from the fault free and faulty circuits.

46. A system as claimed in claim 38, wherein the system is operable to determine a figure of merit for each one of a plurality of different faulty circuits and determining a composite figure of merit combining all of these.

47. A computer program for improving testing of an analogue or mixed-signal circuit using a digitized input test sequence, the computer program being provided on a data carrier or computer readable medium and having code or instructions for:
   inputting a digitized input test sequence to a fault free version of the analogue or mixed signal circuit or computer simulation thereof;
   inputting the same digitized input test sequence to a version of the circuit that has at least one specified fault;
   using an optimization algorithm to vary the input test sequence;
   monitoring the outputs of the fault free and faulty circuits for each digitized input test sequence; and
   identifying a digitized input sequence, wherein the digitized input is used to identify a corresponding digitized output for use in a test mode.

48. A computer program as claimed in claim 47 comprising code or instructions for determining, for each digitized input test sequence, a measure that is indicative of differences between an output of a fault free circuit and an output of known faulty circuit in response to a digitized input test sequence and selecting an optimum digitized input test sequence based on the determined measures for each digitized input test sequence.

49. A computer program as claimed in claim 47 having code or instructions for modelling output responses for the fault free version of the analogue or mixed signal circuit and the version of the circuit that has at least one specified fault.

* * * * *